United States Patent [19]
Yoshino

[11] Patent Number: 6,153,488
[45] Date of Patent: Nov. 28, 2000

[54] METHOD FOR PRODUCING SEMICONDUCTOR DEVICE, AND SEMICONDUCTOR DEVICE PRODUCED BY SAME

[75] Inventor: Chihiro Yoshino, Yokohama, Japan

[73] Assignee: Kabushiki Kaisha Toshiba, Kawasaki, Japan

[21] Appl. No.: 09/229,887

[22] Filed: Jan. 14, 1999

[30] Foreign Application Priority Data

Jan. 14, 1998 [JP] Japan .................................. 10-017814

[51] Int. Cl.$^7$ .................................................. H01L 21/331
[52] U.S. Cl. .......................... 438/345; 438/344; 438/347; 438/348; 438/349; 438/350
[58] Field of Search .................................... 438/341, 344, 438/345, 347, 349, 350, 348

[56] References Cited

U.S. PATENT DOCUMENTS 5,008,208   4/1991   Liu et al. .

FOREIGN PATENT DOCUMENTS 2-30141   1/1990   Japan .
2680358   8/1997   Japan .

Primary Examiner—Long Pham
Attorney, Agent, or Firm—Pillsbury Madison & Sutro LLP

[57] ABSTRACT

A method for producing a semiconductor device including a bipolar transistor, has the steps of: forming an element isolating region in a major surface of a semiconductor substrate to define an element forming region to form a collector region in the element forming region surrounded by the element isolating region; allowing the epitaxial growth of a semiconductor layer on the major surface of the semiconductor substrate to form a base region of the semiconductor layer on the collector region; forming a growth inhibiting film on a region forming the base region of the semiconductor layer; removing the growth inhibiting film to expose a part of the semiconductor layer; covering the upper surface and side wall of the conductive film, which is exposed in the predetermined region, with an insulator film; covering the side wall of the conductive film, which is exposed in the predetermined region; and forming an emitter region in a surface region of the predetermined region of the semiconductor layer, which is surrounded by the conductive film.

7 Claims, 25 Drawing Sheets

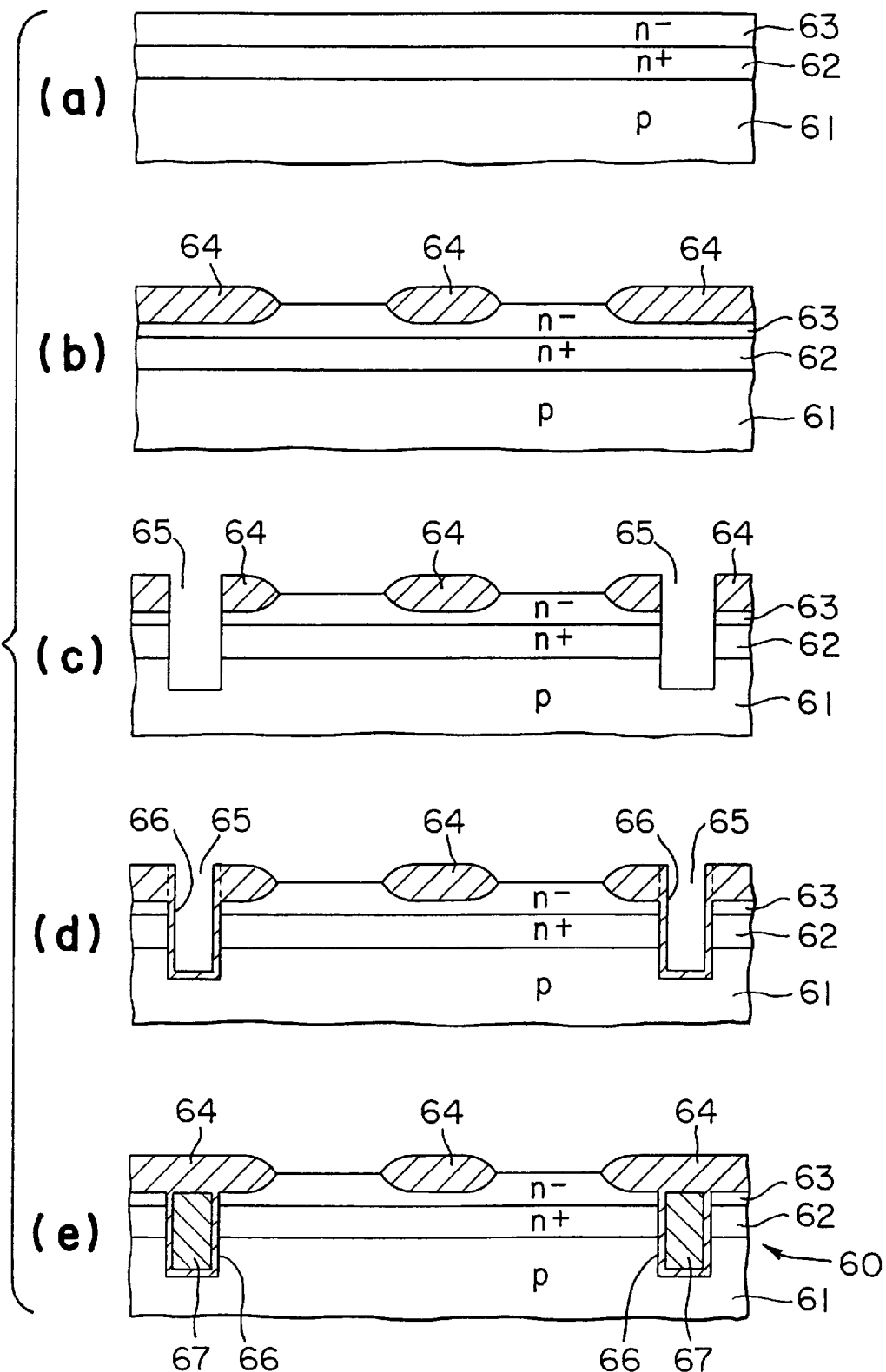
F I G. 18

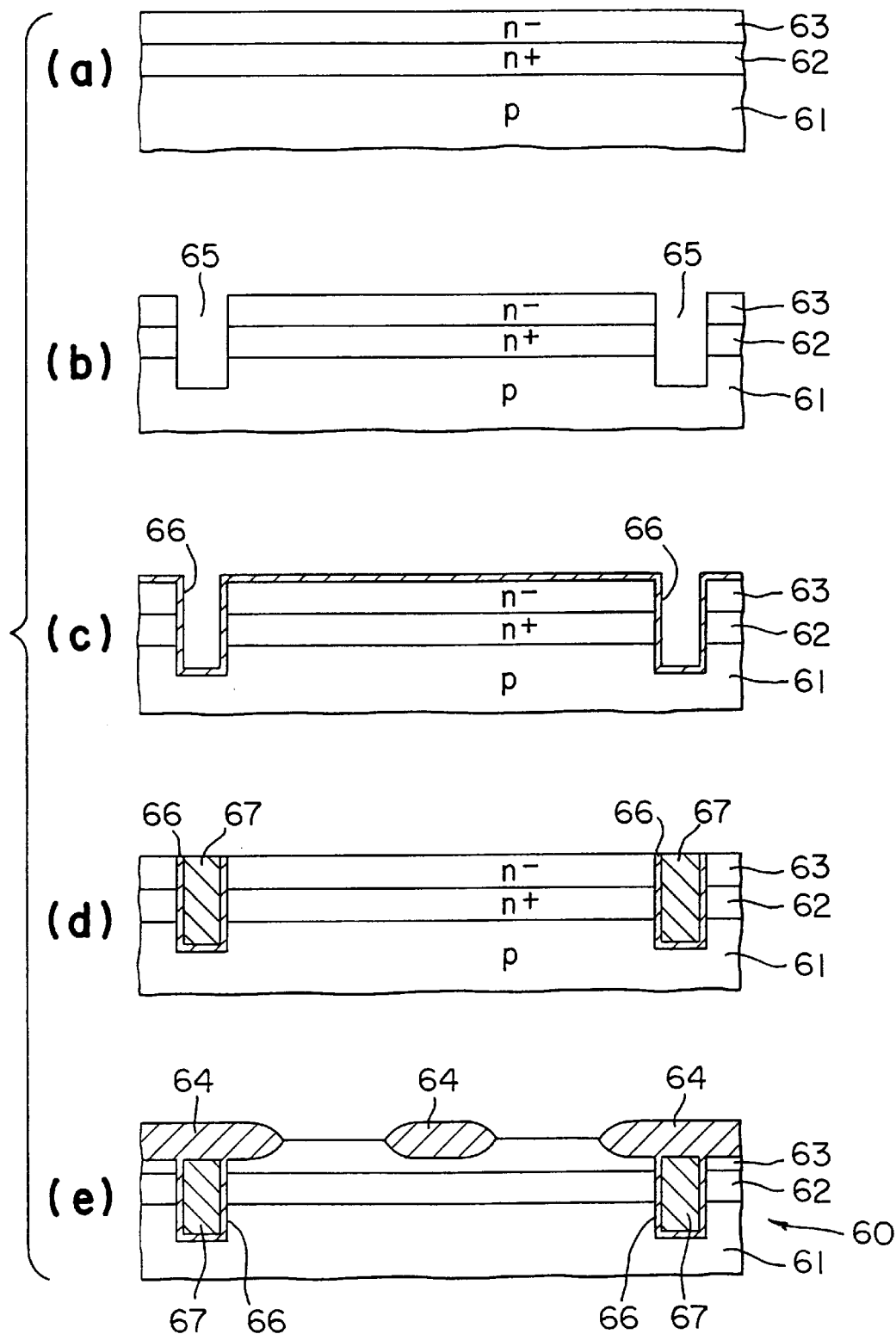
F I G. 19

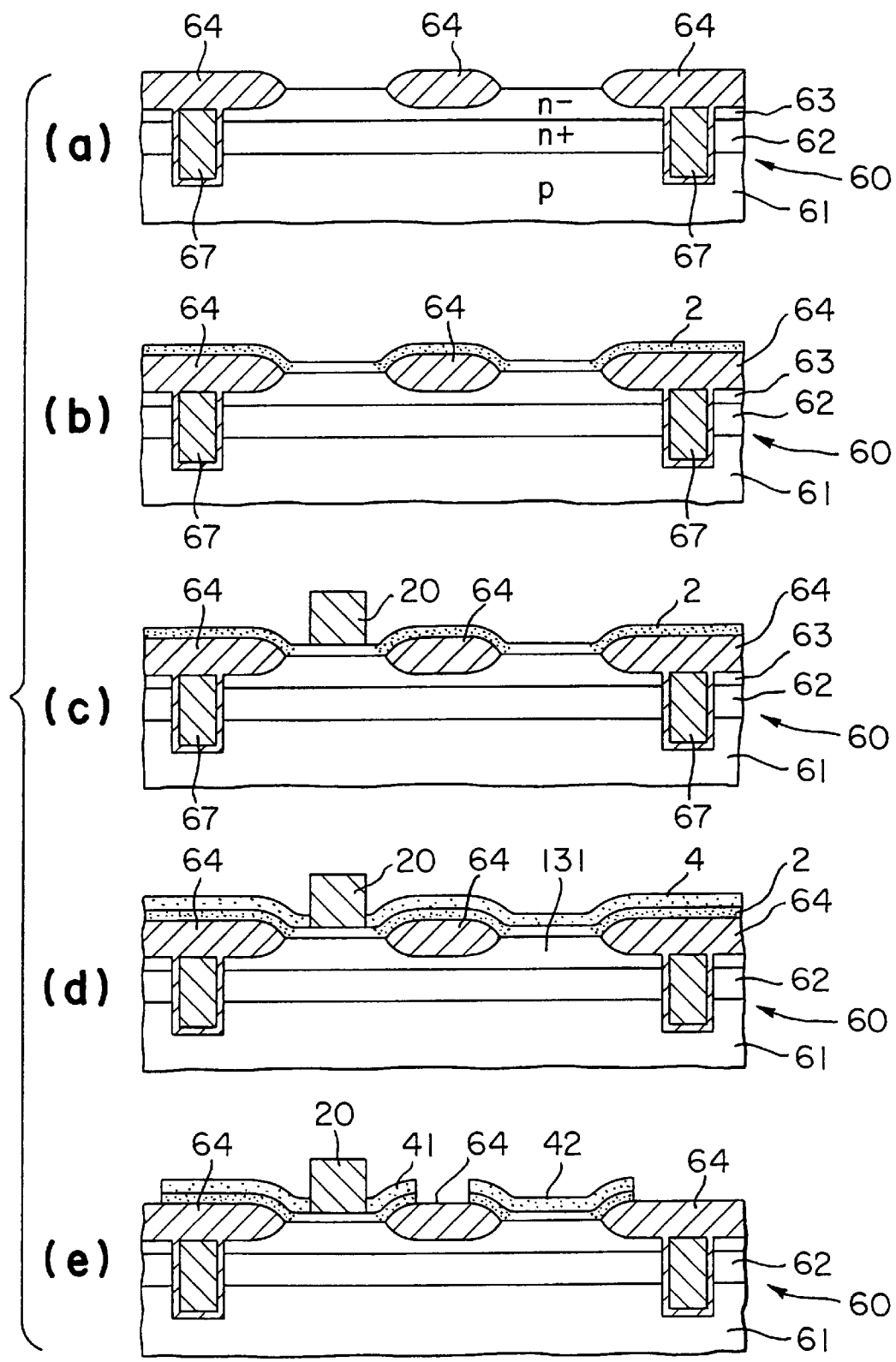
F I G. 20

METHOD FOR PRODUCING SEMICONDUCTOR DEVICE, AND SEMICONDUCTOR DEVICE PRODUCED BY SAME

BACKGROUND OF THE INVENTION

The present invention relates generally to a semiconductor device and a method for producing the same. More specifically, the invention relates to a method for producing a semiconductor device, such a bipolar transistor, which has a small parasitic capacity, a small parasitic resistance and a high performance, and a semiconductor device produced by this method.

In recent years, there is proposed a device capable of realizing accelerating and high integration by forming a shallow junction in a device active region, such as a base layer of a bipolar transistor element, and source/drain and channel regions of a CMOSFET element, using a low temperature epitaxial growth method, and such a device is in the process of practical use. Referring to FIG. 1A through 1H, a conventional bipolar transistor as an example of a semiconductor device having such a structure, and a method for producing the same will be described below.

As shown in FIG. 1H(a), a semiconductor substrate 1 comprises a p-type silicon substrate 11, an $n^+$-impurity diffusion region 12 formed by allowing an n-type impurity to diffuse and grow on one side of the silicon substrate 11 at a high concentration, and an $n^-$-epitaxial growth layer 13 formed by allowing an n-type impurity to epitamially grow on the impurity diffusion region 12 at a low concentration. A trench is formed in the major surface of such a semiconductor substrate 1, i.e., in a surface of the epitaxial growth layer 13, and an insulating material, such as silicon dioxide ($SiO_2$), is filled therein to form an element isolating region 10. The surface of an element forming region, which is a region surrounded by the element isolating region 13 in the major surface of the semiconductor substrate 1, is exposed, and a high concentration impurity diffusion layer 131 serving as a collector region after formation of the element is formed in the epiial growth layer 13. On the semiconductor substrate 1, a bipolar transistor element is formed.

Steps of forming the element will be described. First, refening to FIG. 1A, a p-type silicon substrate 2 containing boron (B) is formed on the major surface of the semiconductor substrate 1 by the nonselective epitaxial growth. The p-type silicon substrate 2 includes an intrinsic base region 2a formed on the element forming region by the epitaxial growth, and a p-type polycrystalline silicon region 2b formed on the element isolating region 10. Then, a silicon oxide film ($SiO_2$) (not shown) is deposited on the silicon semiconductor layer 2 by the CVD (Chemical Vapor Deposition) method, and the anisotropic etching of the silicon oxide film is carnied out using a photoresist (not shown) as a mask to form an etching stopper 3 of an oxide film as shown in FIG. 1B(a). The etching stopper 3 occupies a plane region shown in FIG. 1B(b).

Then, as shown in FIG. 1C, a polyciysaine silicon layer 4 is deposited on the whole surface of the semiconductor substrate 1 so as to cover the silicon semiconductor layer 2 and the etching stopper 3, and boron ions are implanted into the polyciystalline silicon layer 4. Then, the silicon semiconductor layer 2, which has been formed by the non-selective epital growth, and the polycrystaline silicon film 4, into which boron ions have been implanted, are simultaneously patterned to form a base drawing electrode 41 and a collector drawing electrode 42 (not shown). Then, as shown in FIG. 1D, a silicon nitride film ($Si_3N_4$) 5 is deposited on the semiconductor substrate 1 so as to cover the base drawing electrode 41 and collector drawing electrode 42, which have been allowed to remain after patterning, as well as the underlying polycrystalene silicon film 2. FIG. 1D(b) is a schematic plan view of the silicon nitride filMm 5 for covering the base drawing electrode 41, the collector drawing electrode 42 and the etching stopper 3.

Then, an opening 6 is formed in the base drawing electrode 41 and a portion of the silicon nitride film 5, which covers the base drawing electrode 41, by an anisotropic etching, such as the RIE (Reactive Ion Etching). At this time, the etching stopper 3 formed on the silicon semiconductor layer 2 is exposed to the bottom of the opening 6 as shown in FIG. 1E. Then, a silicon nitride film (not shown) is deposited on the whole surface of the semiconductor substrate 1, and a nitride film 7 is formed on the inner surface of the opening 6 by an anisotropic etching, such as the RIE. Then, as shown in FIG. 1F, the etching stopper 3 in the opening 6 is removed by etching with ammonium fluoride ($NH_4F$) solution to expose the surface of the semiconductor layer 2. Therefore, at this time, the etching stopper 3 is allowed to remain under the nitride film 7 formed on the side wall of the opening 6.

Then, a polycrystalline silicon film (not shown) is deposited on the whole surface of the silicon nitride film 5, and the ion implantation of arsenic (As) into the polycrystailline silicon film is carried out. Moreover, after a heating step, the arsenic in the polycrystalline silicon film is allowed to diffuse in the silicon semiconductor layer 2 to form an emitter region 9 in a portion in which the arsenic diffuses. Moreover, as shown in FIG. 1G, the polycrystalline silicon film is patterned by an anisotropic etching, such as the RIE, to form an emitter drawing electrode 8.

Then, an interlayer insulator film 14 of a silicon oxide film or the like is deposited on the emitter drawing electrode 8 and the silicon nitride film 5, and then, a contact hole is formed in the interlayer insulator film 14 to expose the emitter drawing electrode 8. Then, an emitter metal electrode 15 electrically connected to the exposed emitter drawing electrode 8 is formed of a metal, such as aluminum. At this time, contact holes are also formed in the silicon nitride film 5 and the base drawing electrode 41 and collector drawing electrode 42 of the interlayer insulator film 14 deposited thereon, and then, a base metal electrode 16 and a collector metal electrode 17, which are electrically connected to the base drawing electrode 41 and the collector drawing electrode 42, respectively, are formed of a metal, such as aluminum (see FIGS. 1H(a), (b) (c)).

In the above described conventional method for producing a semiconductor device, the polycrystalline silicon film serving as the base drawing electrode is partially removed by the anisotropic etching to form the emitter opening, so that it is required to form the silicon oxide film serving as the etching stopper 3. In addition, it is required to form doubling margins 23, 23 between the etching stopper 23 and the opening defining the emitter region 9 as shown in FIG. 1H(c).

However, although excessive base current flows through the base region 9 in the semiconductor layer 2 by the doubling margins 23, the semiconductor layer 2 of a monocrystalline silicon has a higher value of resistance than that of the polycrystalline silicon film 4 for the base drawing electrode 41, so that the base resistance is tend to increase. There is a problem in that the increase of the base resistance causes the operation speed of the transistor element to decrease, so that noises increase when an analog operation is carried out.

In addition, the area of the element region is increased by the doubling margins 23, so that the base-to-collector capacity is tend to increase. There is a problem in that the increase of the base-to-collector capacity decrease the operation speed of the transistor element to increase electric power consumption.

SUMMARY OF THE INVENTION

It is therefore an object of the present invention to eliminate the aforementioned problems and to provide a semiconductor device, which has a small element region to reduce base resistance and base-to-collector junction capacity to decrease electric power consumption and which can operate at a high speed with low noise.

In order to accomplish the aforementioned and other objects, a method for producing a semiconductor device, according to the present invention, includes the steps of forming an insulator film on a part of a semiconductor layer including a single crystal formed on an element forming region by the epitaxial growth; forming a conductive film in a region other than a region, in which the insulator film on the semiconductor layer is formed, by the selective growth; and removing the insulator film to expose a part of the semiconductor layer.

That is, according to a first aspect of the present invention, a method for producing a semiconductor device, comprises the steps of: allowing the epitaxial growth of a semiconductor layer on a major surface of a semiconductor substrate; forming a growth inhibiting flm in a predetermined region on the semiconductor layer; allowing a conductive film to selectively grow on the semiconductor layer on which the growth inhibiting film has been formed; removing the growth inhibiting film to expose a part of the semiconductor layer; covering the upper surface and the side wall of the conductive film, which is exposed in the predetermined region, with an insulator film; and forming an emitter region in a surface region of the predetermined region of the semiconductor layer, which is surrounded by the conductive film.

According to a second aspect of the present invention, a method for producing a semiconductor device, comprises the steps of: forming an element isolating region in the major surface of a semiconductor substrate to define an element forming region to form a collector region in the element isolating region; allowing the epitaxial growth of a semi-conductor layer on the major surface of the semiconductor substrate to form a base region of the semiconductor layer on the collector region; forming a growth inhibiting film on a region forming the base region of the semiconductor layer; removing the growth inhibiting film to expose a part of the semiconductor layer; covering the upper surface and the side wall of the conductive film, which is exposed in the predetermined region, with an insulator film; and forming an emitter region in the surface region of the predetermined region of the semiconductor layer, which is surrounded by the conductive film.

Specifically, the growth inhibiting film may be formed of a silicon nitride film or a silicon oxide film. In addition, the semiconductor layer formed on the major surface of the semiconductor substrate may have a region of a mono-crystalline semiconductor formed on the element forming region, and a region of a polycrystalline semiconductor formed on the element isolating region. Moreover, the conductive film may have a base electrode, which is electrically connected to the base region via the polycrystalline layer of the semiconductor layer.

In addition, a semiconductor device according to the present invention is produced by a process including the steps of: forming an insulator film in a part of a semiconductor layer including a single crystal formed on an element forming region by the epitaxial growth; forming a conductive film in a region other than a region, in which the insulator film on the semiconductor layer is formed, by the selective growth; and removing the insulator flm to expose a part of the semiconductor layer.

Thus, in accordance with a method for producing a semiconductor device according to the present invention, no etching stoppers are used unlike conventional methods, so that the area of the base region can be reduced. As a result, the base resistance can be reduced, and the base-to-collector junction capacity can also be reduced, so that it is possible to provide a semiconductor device which has lower electric power consumption, lower noises when it is used as an analog element, and a higher operation frequency than conventional semiconductor device.

BRIEF DESCRIPTION OF THE DRAWINGS

In the drawings:

FIGS. 18(a) through 18(e) are sectional views showing producing steps of a semiconductor substrate in which an element isolating region is formed by a LOCOS and which is used in the third and fourth preferred embodiments of a method for producing a semiconductor;

FIGS. 19(a) through 19(e) are sectional views showing other producing steps of a semiconductor substrate in which an element isolating region is formed by a LOCOS and which is used in the third and fourth preferred embodiments of a method for producing a semiconductor;

DESCRIPTION OF THE PREFERRED EMBODIMENTS

Referring now to the accompanying drawings, the preferred embodiments of a method for producing a semiconductor device according to the present invention, and a semiconductor device produced by the method will be described in detail below. In the preferred embodiments, a bipolar transistor will be described as an example of the semiconductor device.

Figure 10:
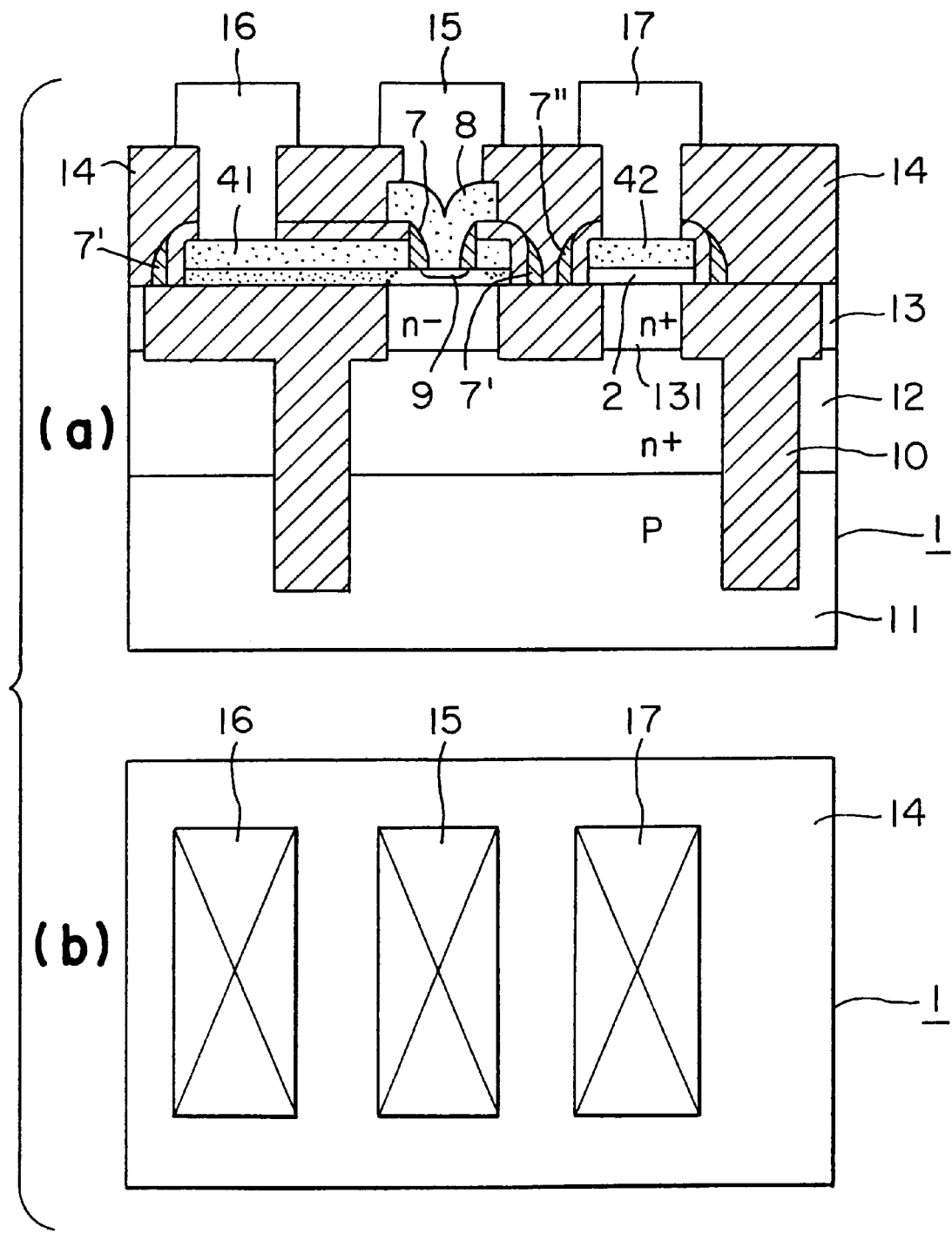
FIGS. 10(a) and 10(b) are sectional and plan views of a semiconductor device produced by the first preferred embodiment of a method for producing a semiconductor device according to the present invention.
Figure 11:
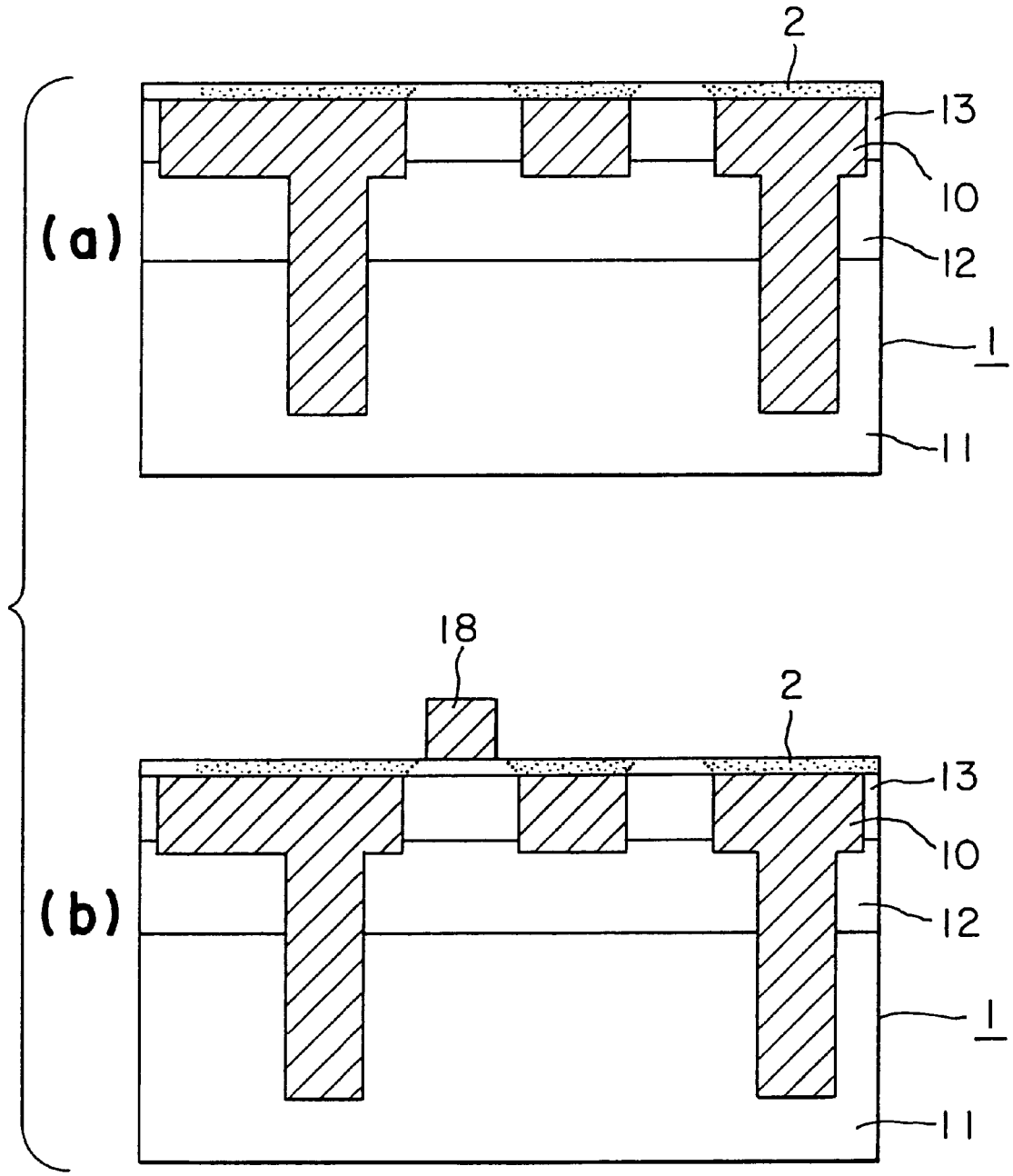
FIGS. 11 through 16 are schematic sectional and plan views showing producing steps in the second preferred embodiment of a method for producing a semiconductor device according to the present invention.

First, referring to FIGS. 2 through 10, the first preferred embodiment of a method for producing a semiconductor device according to the present invention will be described. As shown in FIG. 10, a semiconductor substrate 1 comprises a p-type silicon substrate 11, an $n^+$-impurity diffusion region 12 formed by allowing a high concentration n-type impurity to diffuse in the silicon substrate 11, and an n-epitaxial growth layer 13 formed on the impurity diffusion region 12 by the epitaxial growth. A trench is formed on the major surface of the semiconductor substrate 1 (on the side of the epitaxial growth layer 13), and an insulating material, such as $SiO_2$, is filled therein to form an element isolating region 10. The surface of an element forming region surrounded by the element isolating region (field oxide film) 10 of the major surface of the semiconductor substrate 1 is exposed, and a high concentration impurity region 131 serving as a collector region is formed in the epitaial growth layer 13. In this preferred embodiment, a bipolar transistor is formed on the semiconductor substrate 1 thus formed.

Figure 1A:
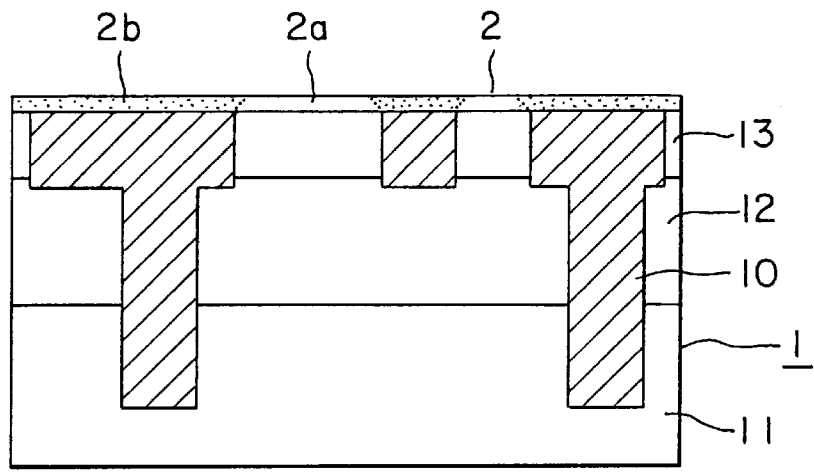
FIGS. 1A through 1H are schematic sectional views showing producing steps of a conventional method for producing a semiconuctor device.
Figure 1B:
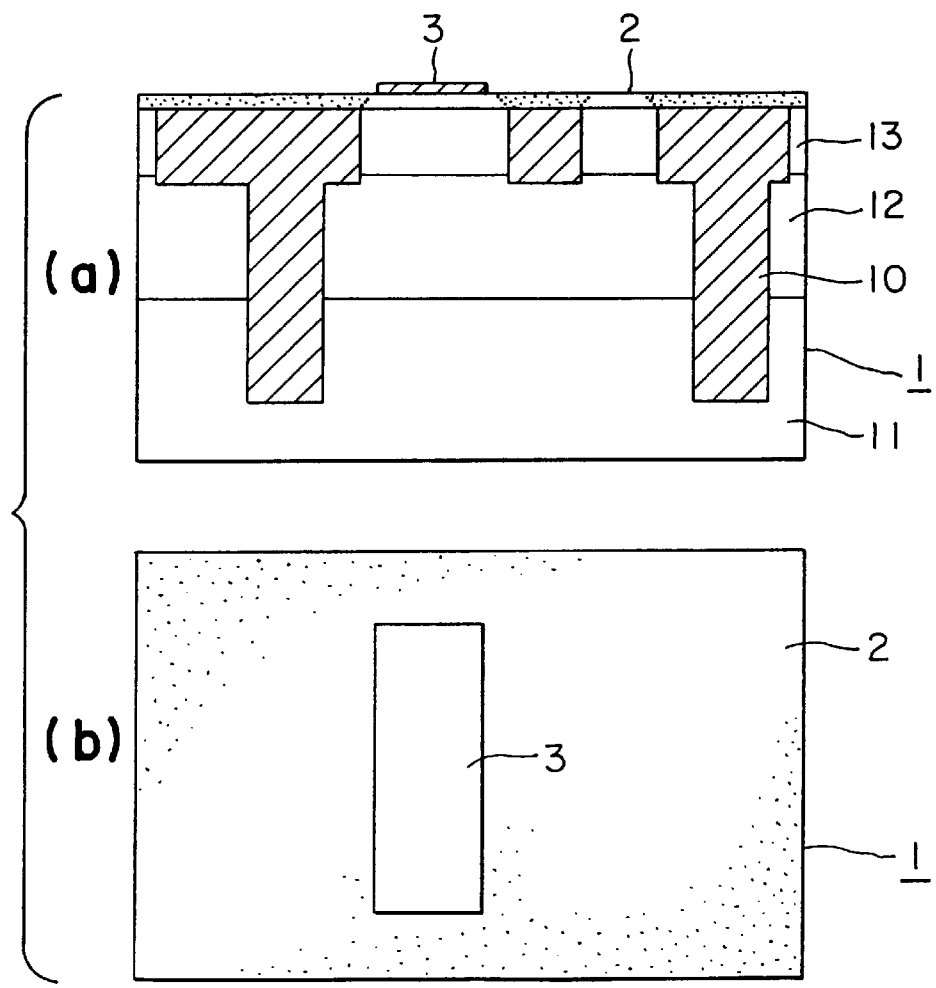
Figure 1C:
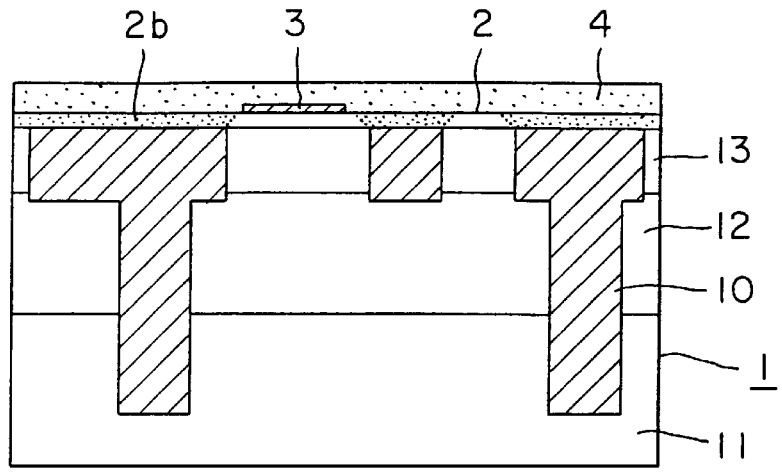
Figure 1D:
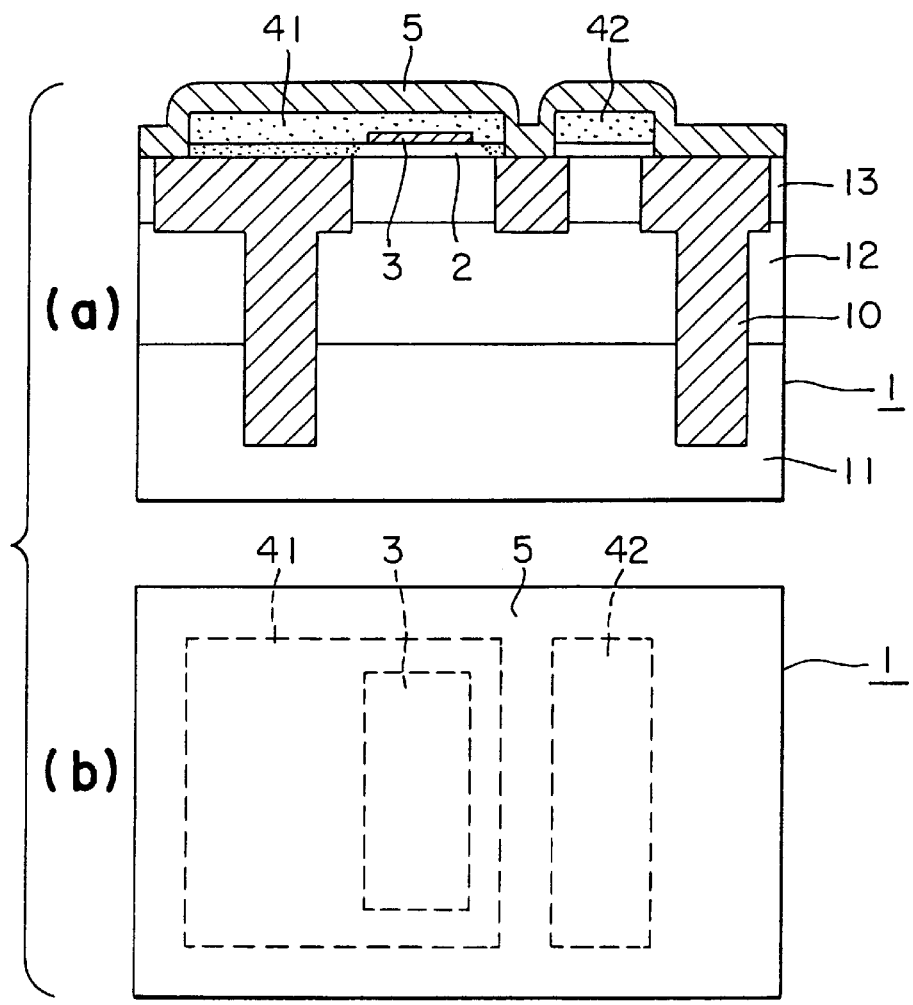
Figure 1E:
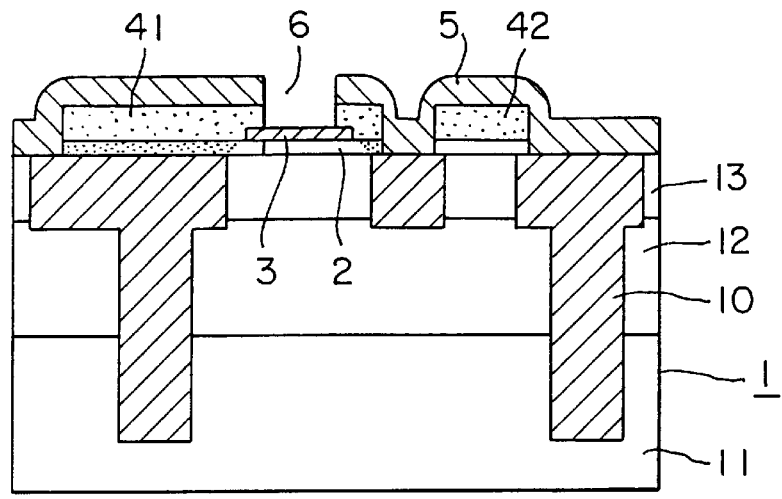
Figure 1F:
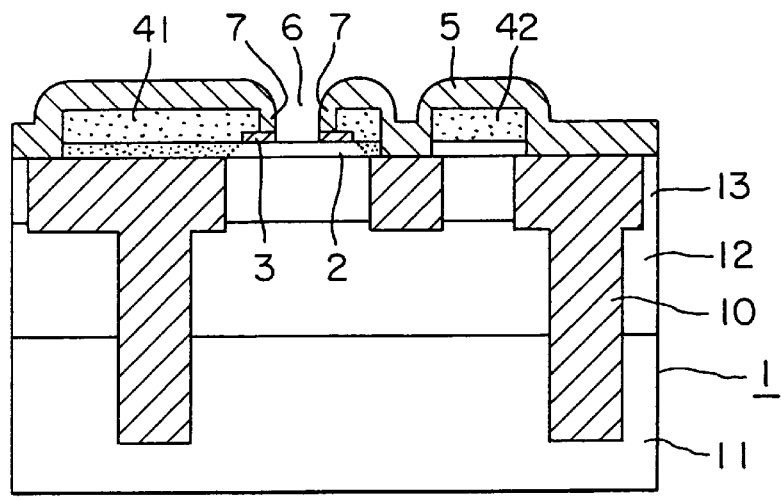
Figure 1G:
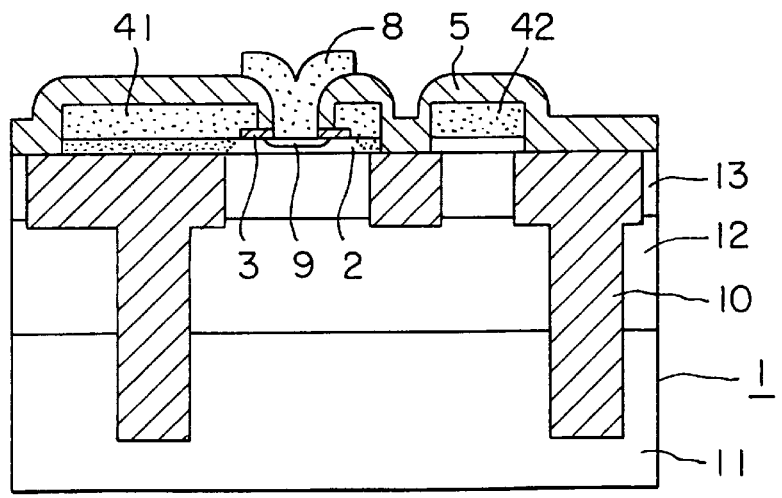
Figure 1H:
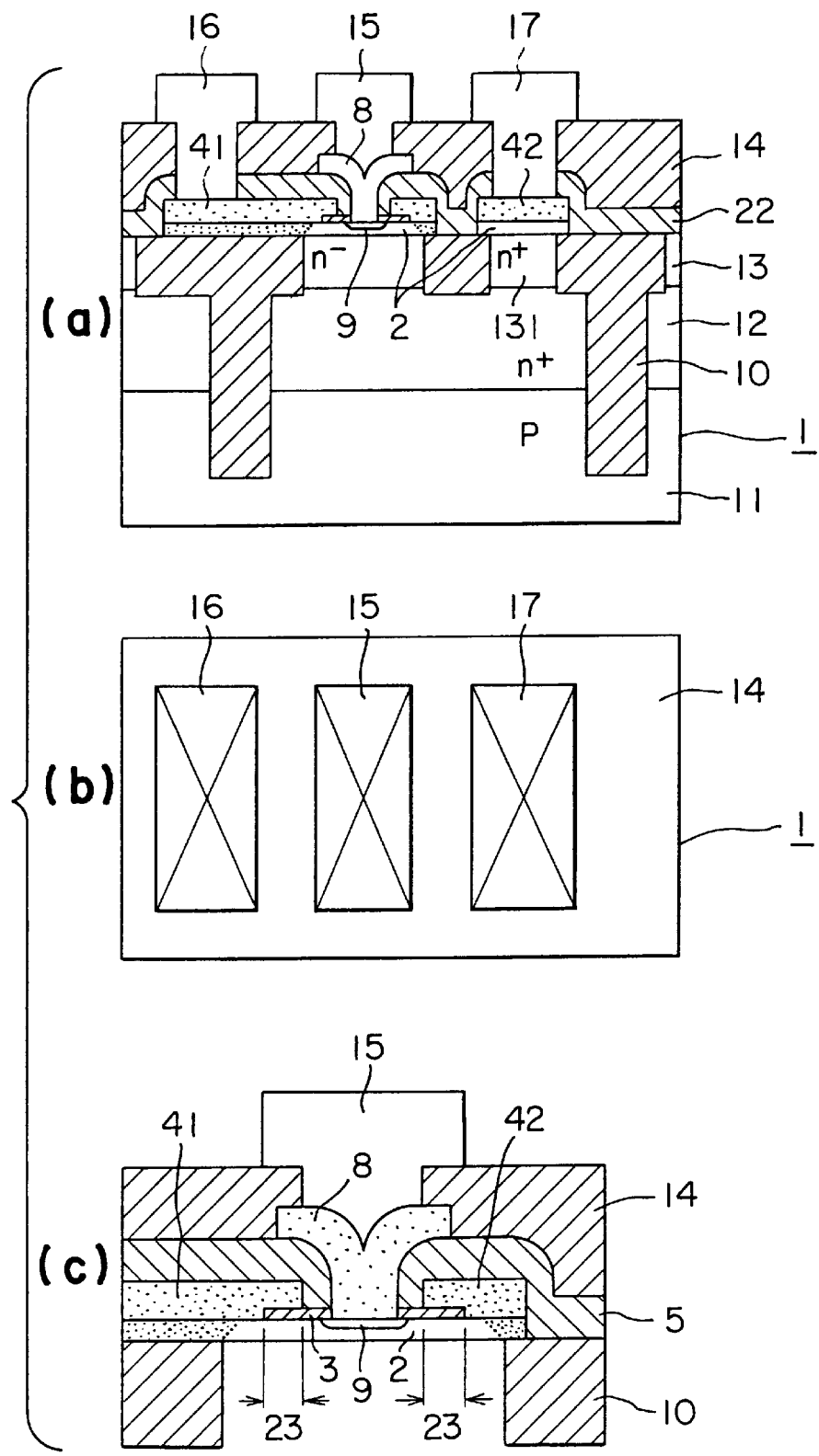
Figure 2:
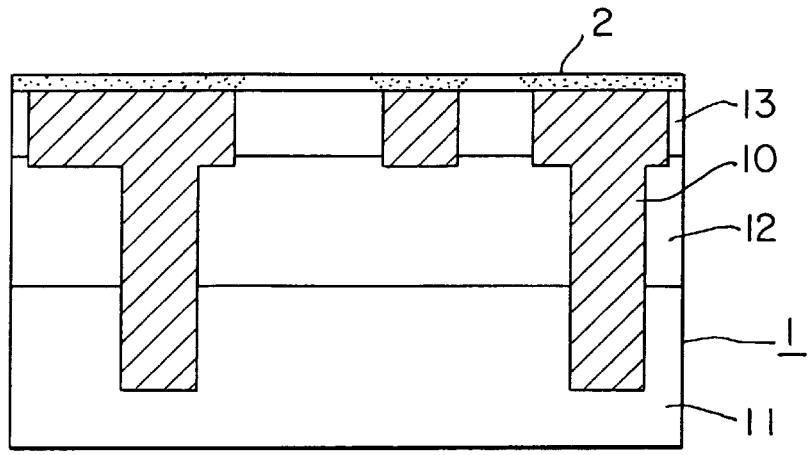
FIGS. 2 through 9 are schematic sectional and plan views showing producing steps in the first preferred embodiment of a method for producing a semiconductor device according to the present invention.

A method for producing a bipolar transistor will be described below. First, on the major surface (the surface in which the epitaxial growth layer 13 is formed) of the semiconductor substrate 1, a p-type silicon semiconductor layer 2 containing boron (B) is formed by the non-selective epitaxial growth. By this epitaxial growth, a p-type mono-crystaline silicon layer containing an intrinsic base region of a p-type mono-crystalline is formed on the element forming region as shown in FIG. 2.

Figure 3:
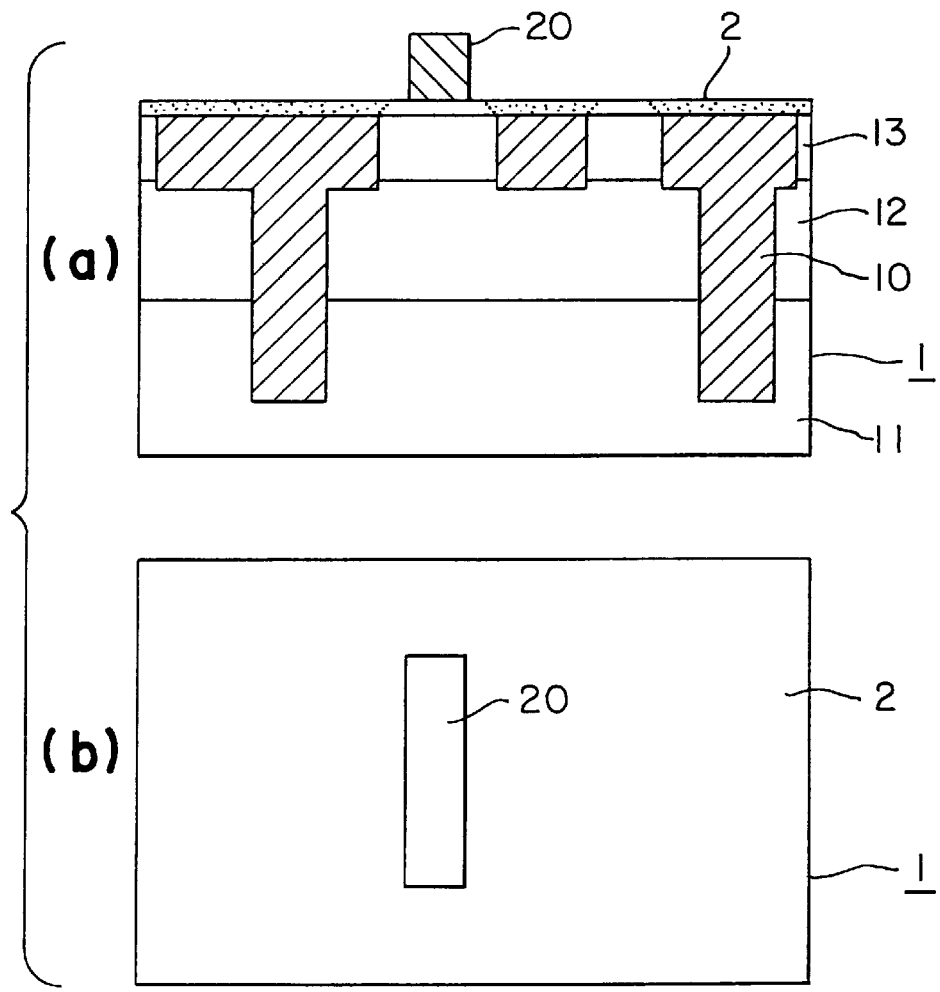

Then, after a thick silicon nutride film ($Si_3N_4$) (not shown) is deposited on the major surface of the semiconductor substrate 1 by the CVD method, the silicon nitride film is etched by an anisotropic etching, such as the RIE, using a patterned photoresist (not shown) as a mask to form a growth inhibiting film 20 on the element region as shown in FIG. 3.

Figure 4:
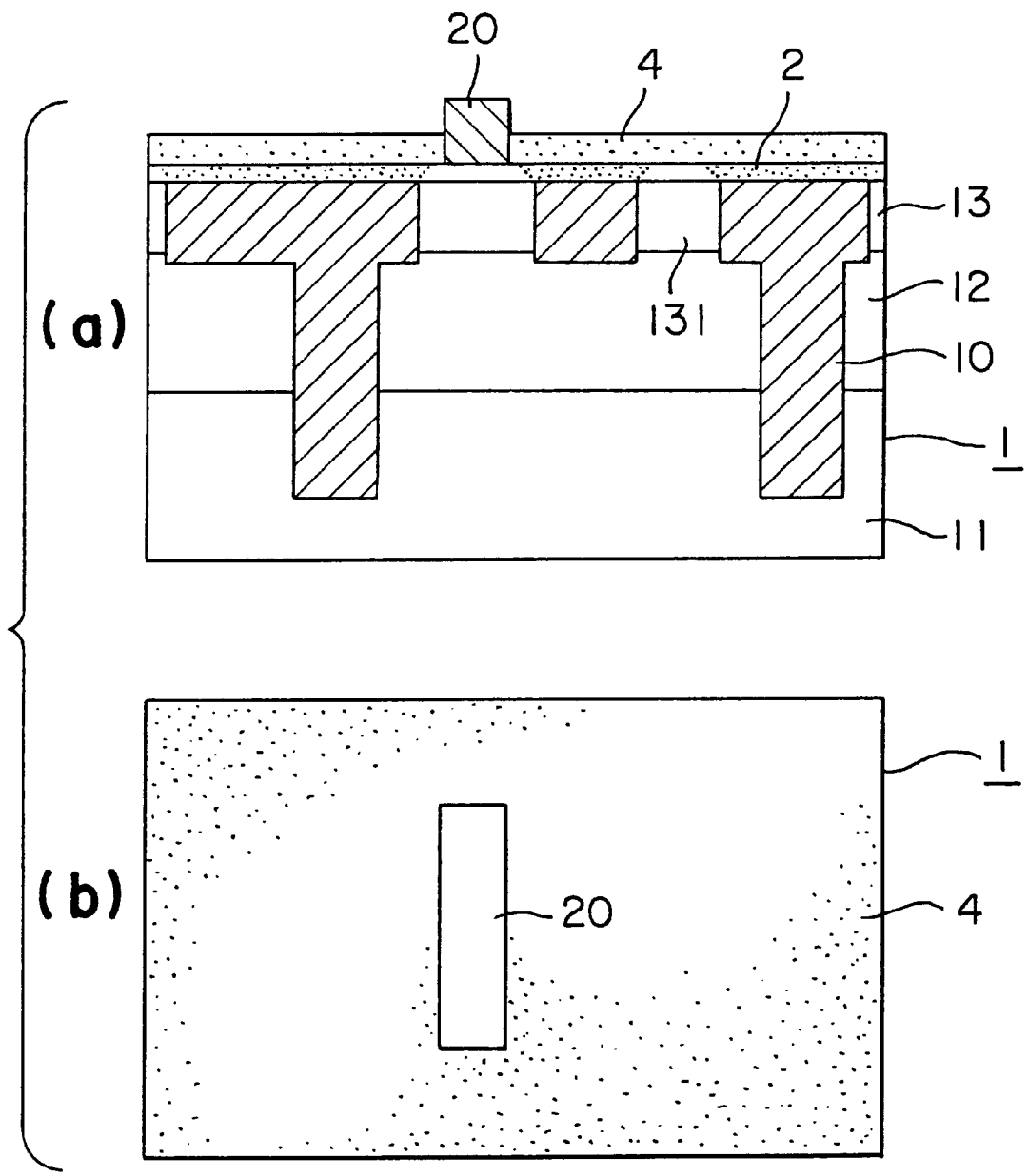

Then, as shown in FIG. 4, silicon is caused to selectively grow on the whole major surface of the semiconductor substrate 1 to deposit a thick polycrystalline silicon film 4 on the silicon semiconductor layer 2 formed by the non-selective epitaxaial growth, and boron (B) ions are implanted into the polycrystaline silicon film 4.

Figure 5:
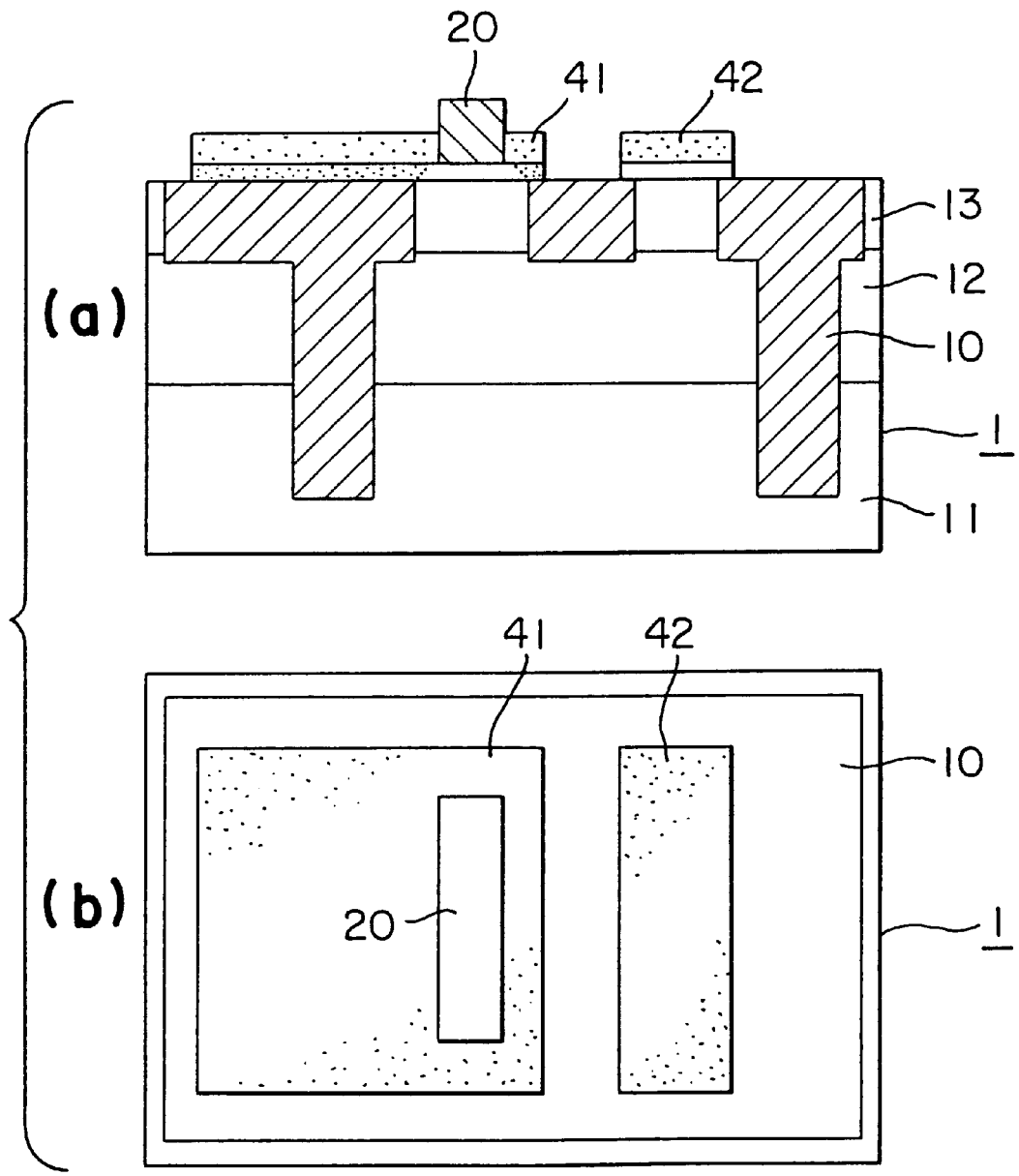

Then, as shown in FIG. 5, the polycrystalline silicon film 4 and the silicon semiconductor layer 2, which has been formed by the non-selective epitaxial growth, are simultaneously patterned to form a base drawing electrode 41 and a collector drawing electrode 42.

Figure 6:
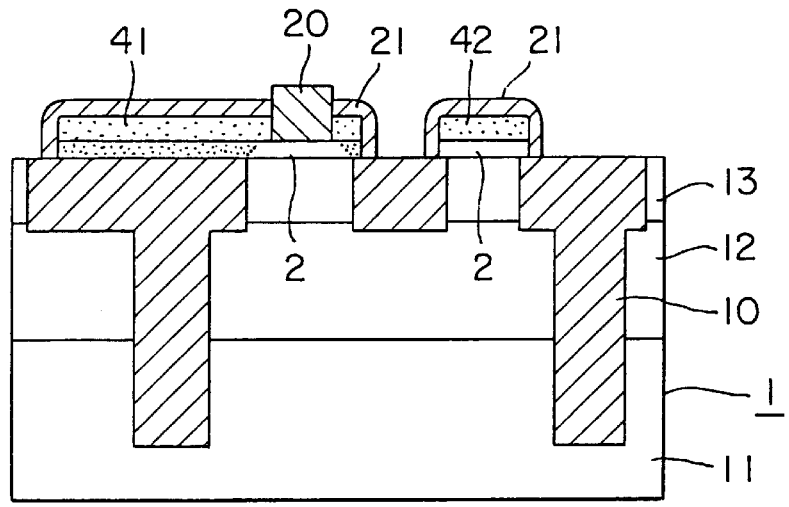
Figure 7:
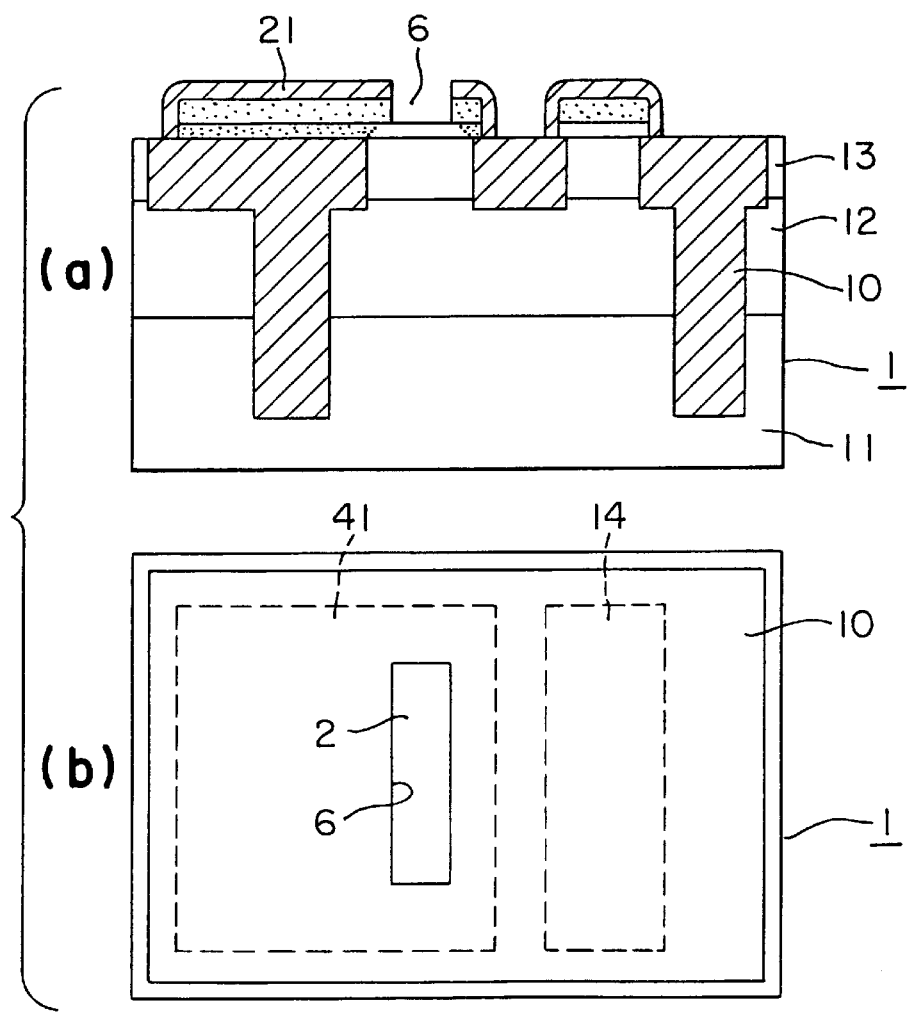

Moreover, as shown in FIG. 6, the growth inhibiting film 20 is allowed to remain, and an oxide film ($SiO_2$) 21 extending from the side surfaces of the exposed silicon semiconductor layer 2 to the surfaces of the base drawing electrode 41 and the collector drawing electrode 42 is formed by a low temperature oxidation process.

Figure 17:
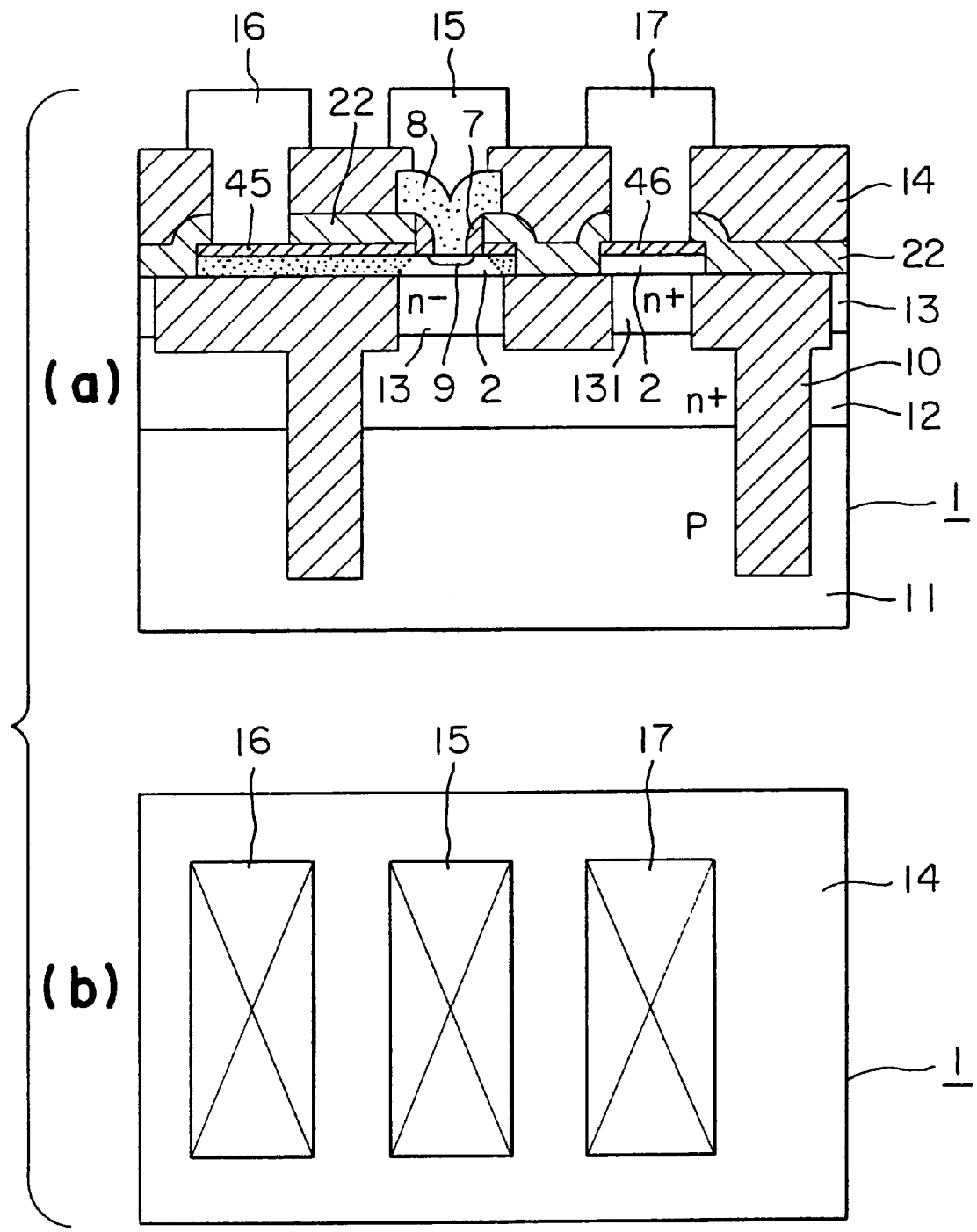
FIGS. 17(a) and 17(b) are sectional and plan views of a semiconductor device produced by the second preferred embodiment of a method for producing a semiconductor device according to the present invention.

Then, as shown in FIG. 17, the growth inhibiting film 20 of a silicon nitride film is removed by the thermal phosphoric acid etching to form an opening 6 therein for defining an emitter region.

Figure 8:
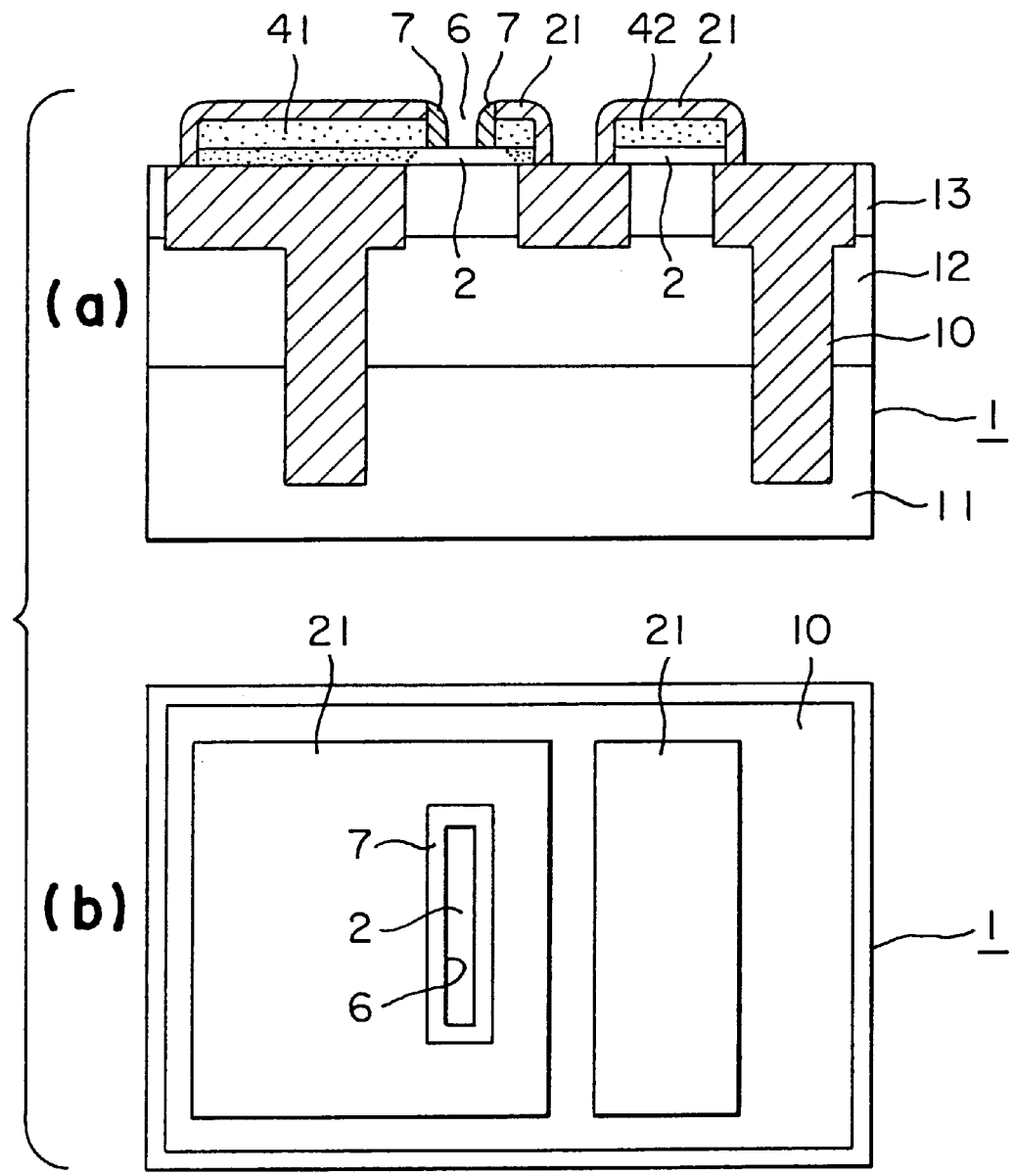
Figure 9:
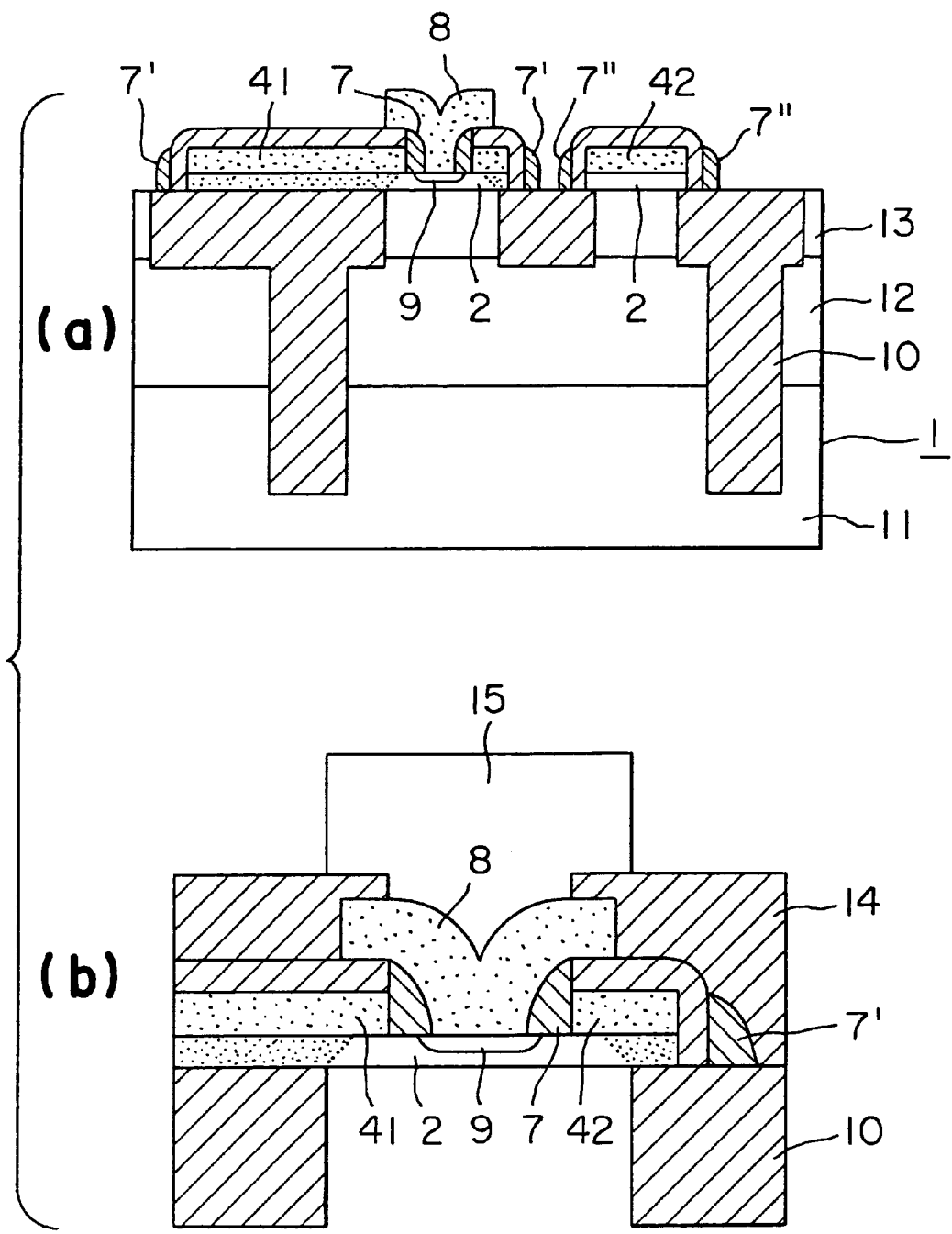

Then, a silicon nitride film (not shown) is deposited on the whole major surface of the semiconductor substrate 1 so as to cover all of the silicon semiconductor layer 2, the opening 6 and the base and collector drawing electrodes 41 and 42. Then, the anisotropic etching, such as the RIE, of the silicon nitride film (not shown) is carried out to form an opening side wall 7 inside of the opening 6 as shown in FIG. 8. As shown in FIG. 8(b), the opening side wall 7 is formed so as to cover the whole side wall of the opening 6.

A polycrystalline silicon film (not shown) serving as an emitter electrode is deposited, and arsenic ions are implanted into the polycrystalline silicon film. Moreover, the arsenic in the polycrystaline silicon film is caused to diffuse in the epitaxial grown semiconductor layer 2 by heat at a heating step to form an emitter region 9.

Moreover, as shown in FIG. 9(b), the polycrystalline silicon film is patterned by an anisotropic etching, such as the RIE, to form an emitter drawing electrode 8. Then, the interlayer insulator film 14 of $SiO_2$ is patterned by, e.g., the CVD method, to form contact holes (not shown) so as to expose the emitter drawing electrode 8, the base drawing electrode 41 and the collector drawing electrode 42. Finally, as shown in FIG. 10(a), metal electrodes 15, 16 and 17 of aluminum or the like are formed so as to be electrically connected to the drawing electrodes 8, 41 and 42 in the contact holes, respectively. Thus, the production of the bipolar transistor on the semiconductor substrate 1 is completed.

In accordance with the first preferred embodiment of a semiconductor device according to the present invention thus produced, it is not required to use any etching stoppers in the middle of production steps unlike the conventional method, the area of the base region is decreased, so that the base resistance is reduced and the base-to-collector junction capacity is reduced. Therefore, in comparison with a semiconductor device produced by the conventional method, electric power consumption is reduced and noises are decreased when it is used as an analog device, so that it is possible to obtain a bipolar transistor serving as a semiconductor device having a high operation frequency.

Referring to FIGS. 11 through 17, the second preferred embodiment of a method for producing a semiconductor device according to the present invention will be described below. FIGS. 11 through 16 are sectional and plan views showing producing steps in the second preferred embodiment of a method for producing a semiconductor device according to the present invention, and FIGS. 17(a) and 17(b) are sectional and plan views showing a bipolar transistor as a semiconductor device produced by the second preferred embodiment of a semiconductor device according to the present invention.

In FIG. 17, a semiconductor substrate 1 comprises a p-type silicon substrate 11, an $n^+$-impurity diffusion region 12 formed by allowing n-type impurity ions to diffuse in the silicon substrate 11 at a high concentration, and an n-epitaxial growth layer 13 allowed to grow on the impurity diffusion region 12. A trench is formed in the major surface of the semiconductor substrate 1 (on the side of the epitaxial growth layer), and an insulating material, such as $SiO_2$, is filled in the trench to form an element isolating region 10. The surface of an element forming region surrounded by the element isolating region (field oxide film) 10 of the major surface of the semiconductor substrate 1 is exposed. In the epitaxaial growth layer 13, a high concentration impurity region 131 serving as a collector region is formed. The second preferred embodiment of a bipolar transistor according to the present invention is formed on the semiconductor substrate 1 thus formed.

First, as shown in FIG. 11(a), a p-type silicon semiconductor layer 2 containing boron (B) is formed on the major surface of the semiconductor substrate 1 (on the surface on which the epitaxial growth layer 13 is formed) by the non-selective epitaxial growth. A p-type mono-crystaline silicon layer containing a p-type mono-crystalline intrinsic base region is formed on the element forming region by the epitaial growth, and a p-type mono-crystaine silicon layer is formed on a field oxide film of the element isolating region 10.

Then, as shown in FIG. 11(b), a thick silicon oxide film (SiO$_2$) is deposited on the major surface of the semiconductor substrate 1 by the CVD method, and etched by an anisotropic etching, such as the RIE, using a patterned photoresist (not shown) as a mask to form a growth inhibiting film 18 of a silicon oxide film on the element region.

Figure 12:
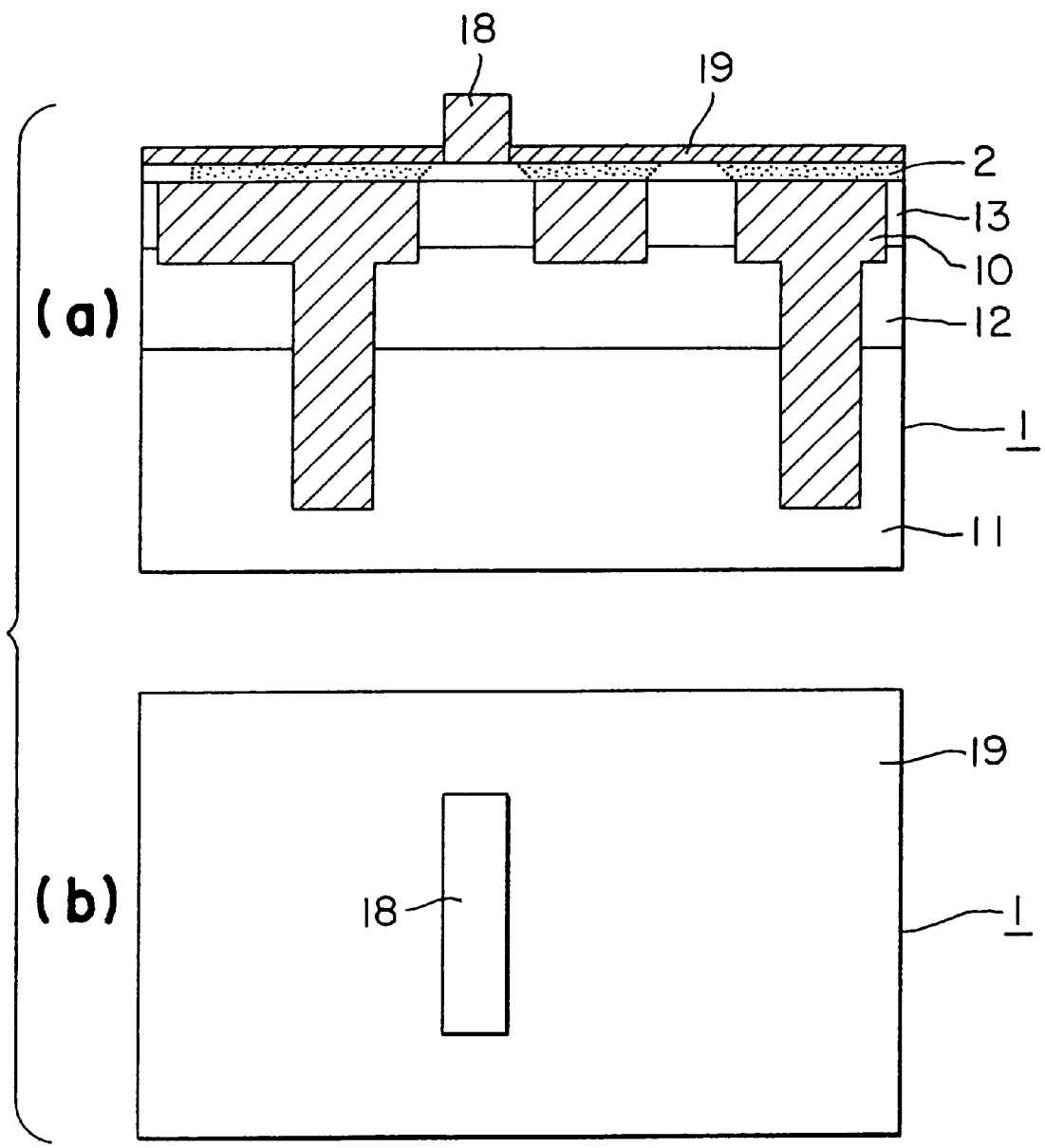

The selective growth of tungsten or the like on the major surface of the semiconductor substrate 1 is carried out. That is, a tungsten film 19 is deposited on the silicon semiconductor layer 2. As shown in FIG. 12, the growth inhibiting film 18 is made of a silicon oxide film, so that the tungsten does not substantially grow on the silicon oxide film.

Figure 13:
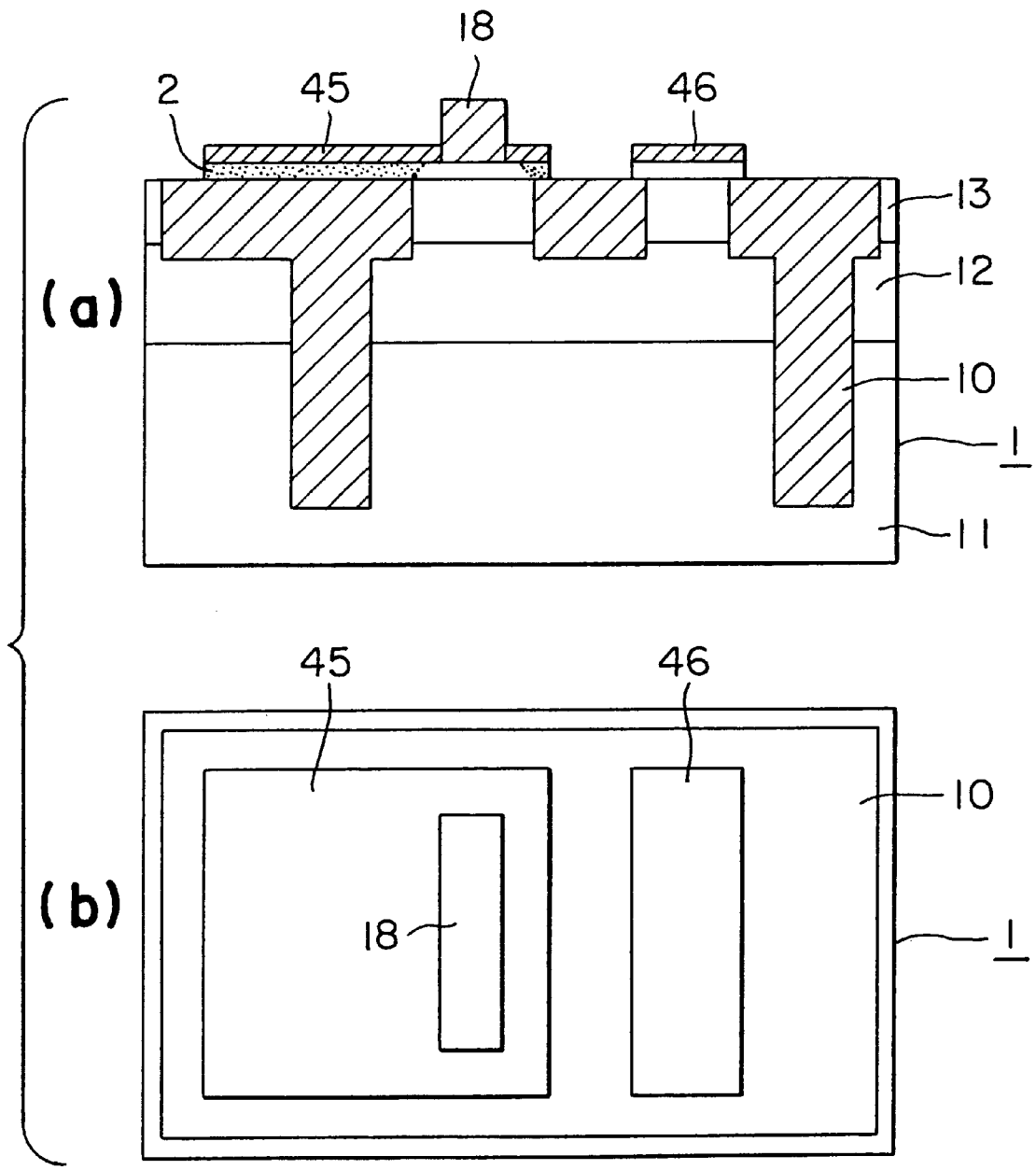
Figure 14:
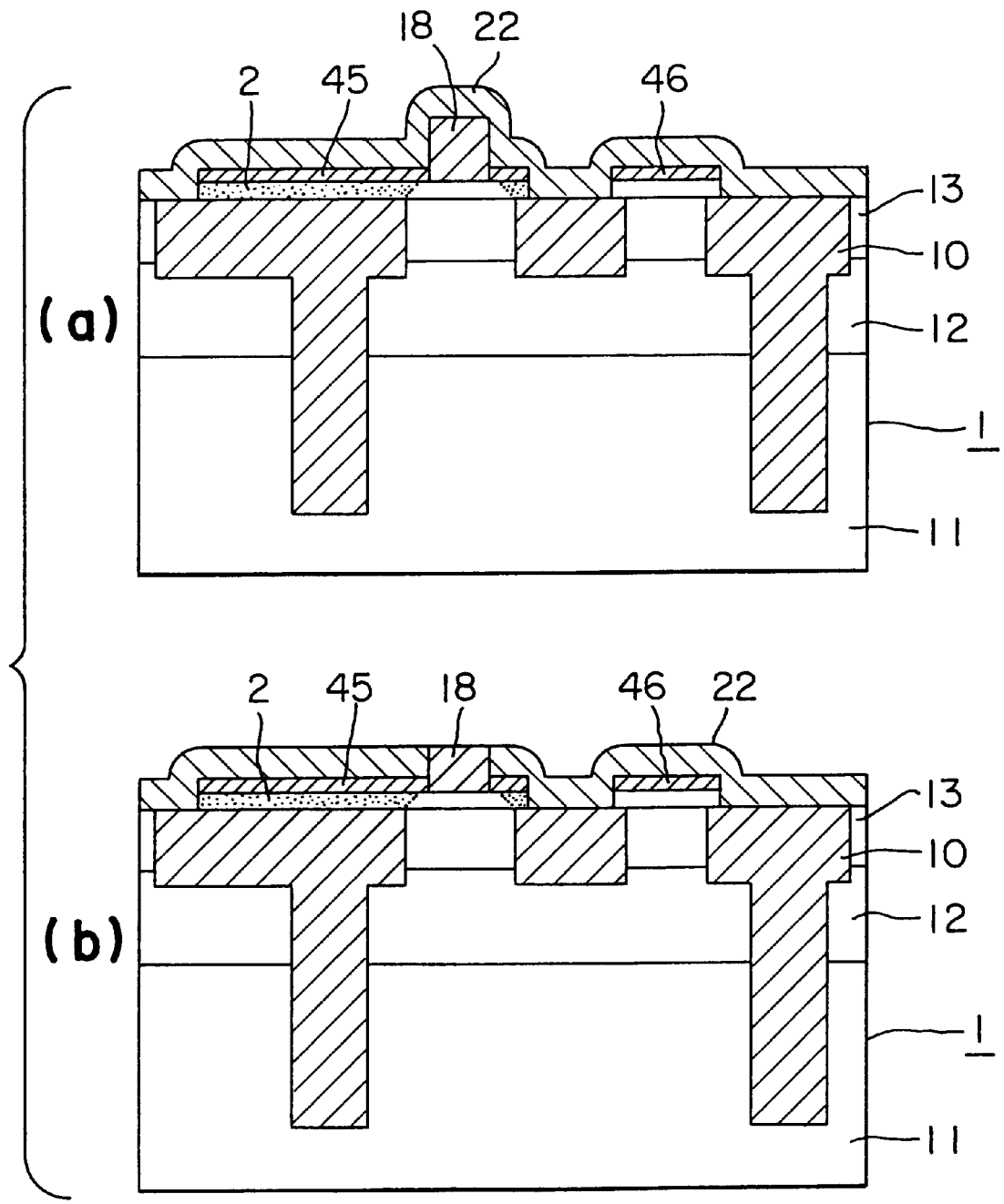
Figure 15:
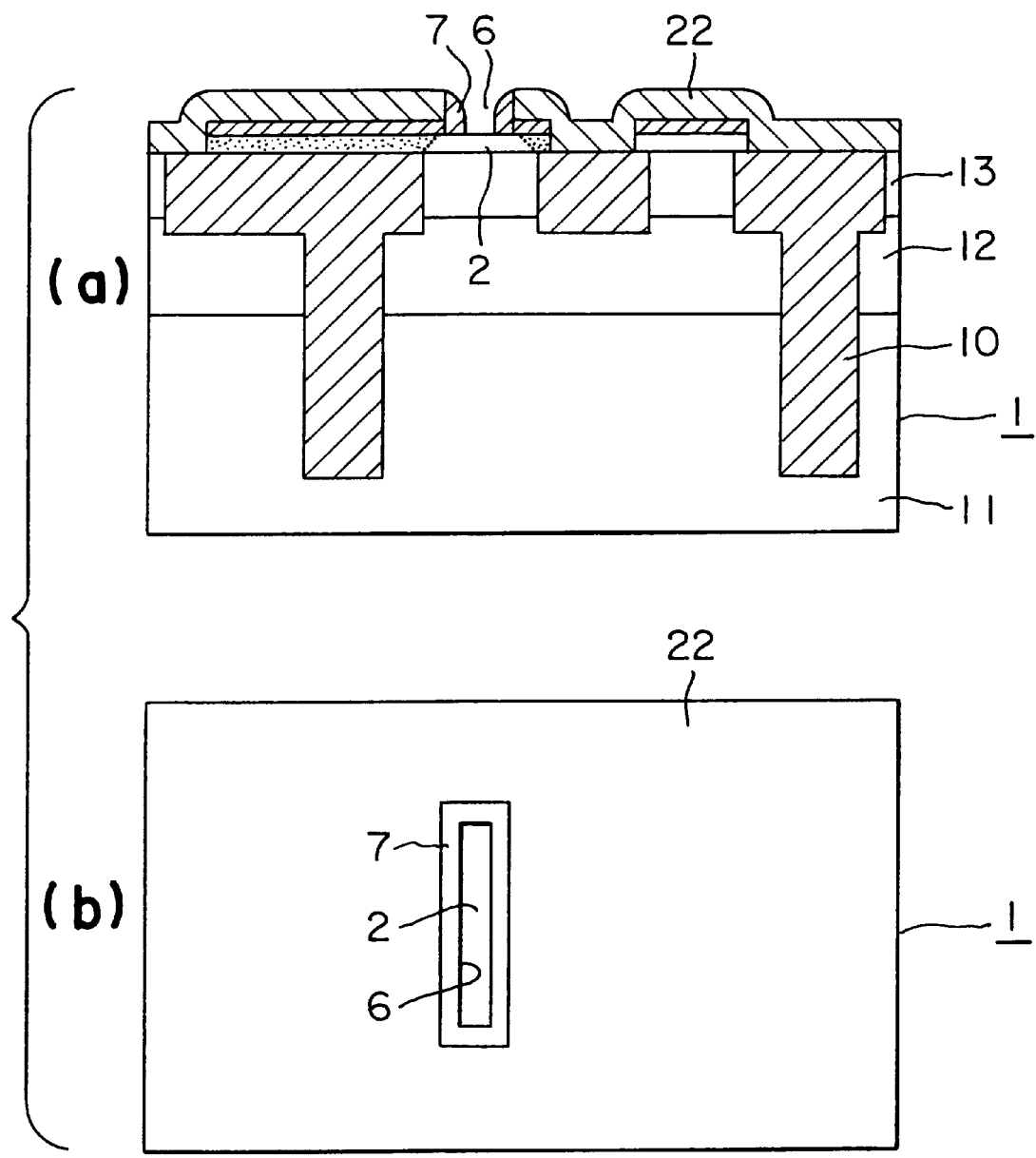
Figure 16:
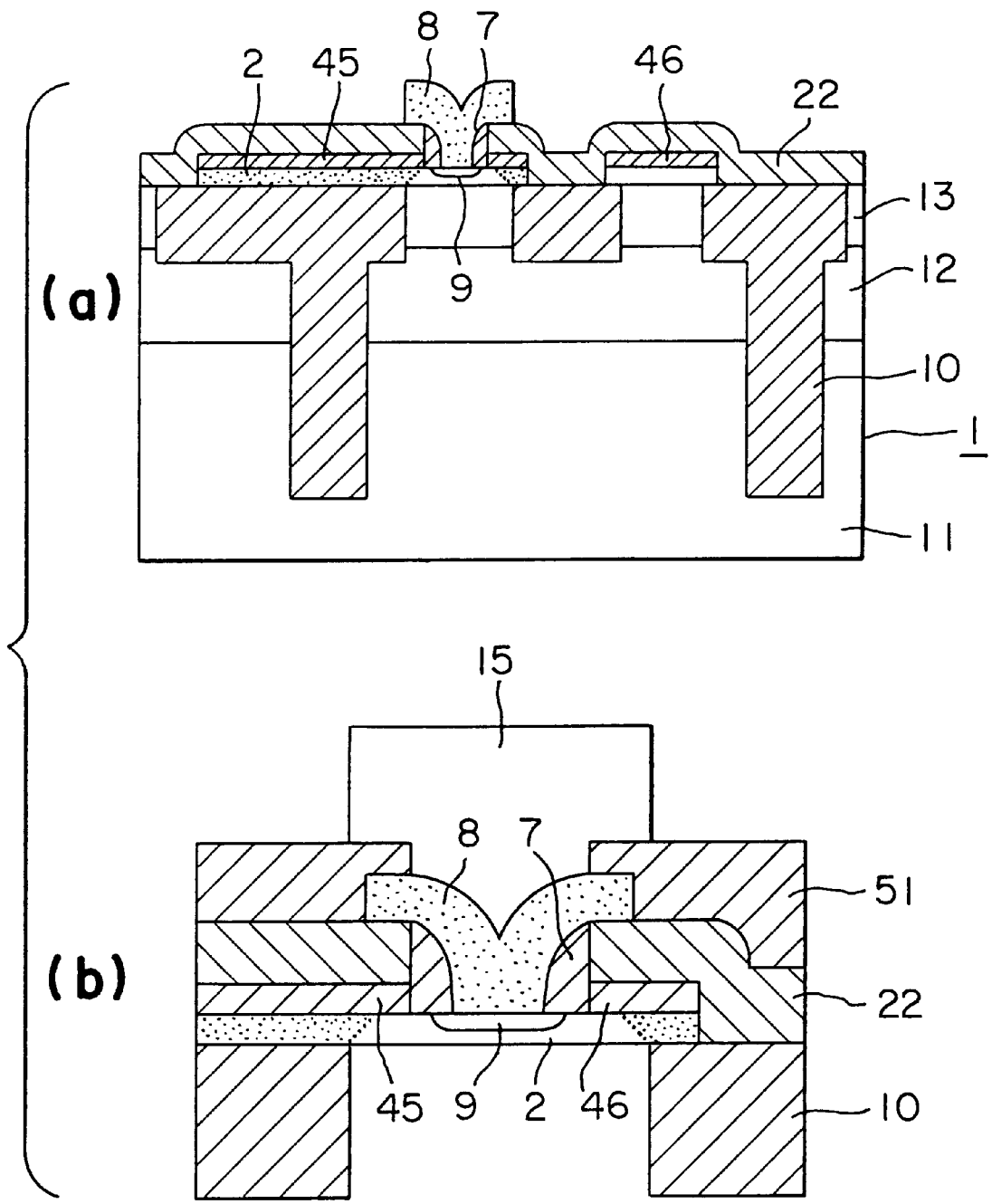

Then, as shown in FIG. 13, the silicon semiconductor layer 2 formed by the non-selective epitaxial growth, together with the tungsten film 19, is patterned to form a base drawing electrode 45 and a collector drawing electrode 46.

Moreover, as shown in FIG. 14(a), a silicon nitride film 22 is deposited on the semiconductor substrate 1 so as to cover the exposed side of the silicon semiconductor layer 2 and the surfaces of the base drawing electrode 45, the collector drawing electrode 46 and the growth inhibiting film 18 while allowing the growth inhibiting film 18 to remain.

Thereafter, as shown in FIG. 14(b), the silicon nitride film 22 on the growth inhibiting film 18 is removed by a polishing method, such as a chemical mechanical polishing method (CMP), to expose the growth inhibiting film 18.

Then, the growth inhibiting film 18 of a silicon nitride film is removed by etching NH$_4$F to form an opening 6 for defining an emitter region. Thereafter, as sown in FIG. 15, the anisotropic etching, such as the CVD method, of the whole surface of the semiconductor 1 is carried out to form a side wall 7 of an oxide film inside of the opening 6. Thereafter, a polycrystalline silicon film serving as an emitter drawing electrode is deposited, and then, arsenic (As) ions are implanted into the polyciystalline silicon. A heating step is carried out to allow the arsenic in the polycrystalline silicon to diffuse in the silicon semiconductor layer 2 to form an emitter region 9. Moreover, as shown in FIG. 16(a), the polyciystalline silicon film is patterned by the anisotropic etching to form an emitter drawing electrode 8.

Then, an interlayer insulator film 14 of SiO$_2$ is deposited by, e.g., the CVD method, and the interlayer insulator film 14 is patterned to form contact holes so as to expose the emitter drawing electrode 8, the base drawing electrode 45 and the collector drawing element 46 as shown in FIG. 16(b). Thereafter, similar to the. semiconductor device producing method in the first preferred embodiment shown in FIG. 10(a), metal electrodes 15, 16 and 17 are formed of a metal, such as aluminum, so as to be electrically connected to electrodes of contact holes exposing the respective drawing electrodes to complete the production of a bipolar transistor on the semiconductor substrate 1, although these are not shown film the second preferred embodiment.

As described above, since it is not required to use any etching stoppers unlike conventional methods, it is possible to reduce the area of the base region to reduce the base resistance and the base-to-collector junction capacity, so that it is possible to obtain a bipolar transistor which has low power consumption, low noises and a high operation frequency when it is used as an analog element, in comparison with conventional bipolar transistors.

The polishing method (CMP method) used for the second preferred embodiment of a method for producing a semiconductor device according to the present invention will be described below. In a semiconductor wafer treatment step of a method for producing a semiconductor device, the polishing utilizing a polishing machine for the planarization of the metal film, which has been formed on the semiconductor substrate and the deposited films, such as a semiconductor flm and an insulator film, is often used. This polishing machine comprises a polishing plate, to which an abrasive cloth is applied and which is driven by a motor or the like, and an absorbing plate for rotatably supporting a semiconductor substrate and for pressing the rotating semiconductor substrate against the polishing plate. This polishing machine is generally designed to polish the semiconductor substrate by pressing a surface of the rotating semiconductor substrate to be polished, against the abrasive cloth on the rotating polishing plate while supplying an abrasive material (also called slurry) to a point to be worked. The abrasive material comprises abrasive particles, such as silica, cerium oxide and silicon nitride, which are allowed to disperse in a solvent.

In the conventional producing method shown in FIGS. 1A through 1H, it is required to use the oxide film 5 serving as an etching stopper, so that it is required to provide the doubling margins 15 between the etching stopper and the opening for defining the emitter region. Similar to the producing method in the first preferred embodiment, in accordance with the second preferred embodiment of a method for producing a semiconductor device according to the present invention, no doubling margins are formed unlike the conventional producing method. Therefore, it is possible to prevent the area of the base region to increase and it is possible to prevent the base-to-collector capacity to increase, so that it is possible to reduce noises and electric power consumption and to accelerate operation speed.

In addition, in accordance with the second preferred embodiment of a method for producing a semiconductor device according to the present invention, the electrodes are formed by the selective growth while remaining the growth inhibiting film in the region to be open, so that it is not required to carry out the anisotropic etching of the electrodes. Therefore, it is not required to provide the etching stopper, and it is not required to provide the doubling margins between the etching stopper and the opening of the emitter region, which are required for the conventional producing method.

Moreover, in the conventional producing method, the portion under the etching stopper is formed simultaneously with the intrinsic base region, so that the resistance is higher than that of the base drawing electrode layer. However, since it is not required to provide the high resistance region under the etching stopper, it is possible to considerably reduce the base resistance. In addition, in comparison with the conventional producing method, the area of the element region can be reduced by a space to be occupied by the doubling margins, so that the area of the base-to-collector junction can be decreased to reduce the base-to-collector capacity. As a result, the operation frequency increases and noises decrease, so that it is possible to provide a bipolar transistor having low power consumption.

In the above described first and second preferred embodiments of a method for producing a semiconductor device according to the present invention, while the element isolating region has been formed by burying the insulating material in the trench formed in the major surface of the semiconductor substrate, the present invention should not be limited thereto, but the element isolating region may be formed by LOCOS (LOCalized Oxidation of Silicon).

There is described methods of producing a semiconductor device according to the third and fourth embodiment of the present invention as detailed examples in which an element isolating region is formed by the LOCOS. First, the semiconductor devices according to the third and fourth embodiments use the semiconductor substrate in which the element isolation region is produced by steps shown in FIG. 18 or FIG. 19.

The substrate in which the element isolating region is formed, is produced by the first method disclosed in FIGS. 18(a) through 18(e) and a second method disclosed in FIGS. 19(a) through 19(e). In FIG. 18(a), the substrate has a p-type silicon substrate 61, an n$^+$-impurity diffusion region 62 formed by allowing a high concentration n-type impurity to diffuse in the silicon substrate 61, and an n$^-$-epitaxaial growth layer 63 formed on the impurity diffusion region 62 by the epitaxial growth. Then, as shown in FIG. 18(b), a LOCOS layer 64 is selectively formed on the surface of the n-epitaxial growth layer 63 to isolate an element region.

Next, as shown in FIG. 18(c), a deep trench 65 is formed from the LOCOS layer 64 through the n-epitaxial growth layer 63 and the impurity diffusion region 62 to p-type silicon substrate 61, so as to oxidize an inner wall of the deep trench 65 to form an oxide layer 66. Then, a polycrystaline silicon 67 is filled into the trench 65, the upper surface of the LOCOS layer 64 is nitrified or oxidized again to a semiconductor substrate 60 including the element isolating region having the deep trench oxidized isolation layer 66 and the shallow LOCOS layer 64.

Filling the polycrystalline silicon 67 into the deep trench 65 is to prevent the partial disunity of the heat change of the substrate in the heat processing step because the temperature expansion factors of the oxide layer and silicon layer including the p-layer 61, n-layer 62 and 63 are different from each other if entire the portion in the trench 65 is oxide layer.

In the method of producing the LOCOS substrate shown in FIGS. 18(a) through 18(e), the deep trench 65 is formed after the formation of the LOCOS layer 64. However, the LOCOS layer 64 may be produced by the method shown in FIGS. 19(a) through 19(e). That is, as shown in FIG. 19 (b), the deep trench 65 is first formed, then entire the surface of the low-density n-layer 63 including the inner wall of the deep trench 65 is oxidized (FIG. 19(c)). After that, as shown in FIG. 19(d), the polycrystalline silicon 67 is filled into the deep trench, and three portions of the LOCOS layer 64 are formed, in which two portions are on the deep trenches 65 and one portion is between two portions to isolate the drain from the source.

There is described the third embodiment of a method of producing the bipolar transistor by using the LOCOS substrate 60 formed as above. First, on the major surface (the surface in which the epitaxial growth layer 63 is formed) of the semiconductor substrate 60, a p-type silicon semiconductor layer 62 containing boron (B) is formed by the non-selective epitaxial growth. By this epitaxial growth, a p-type mono-crystalline silicon layer containing an intrinsic base region of a p-type mono-crystalline is formed on the element forming region as shown in FIG. 20(a).

Figure 20:
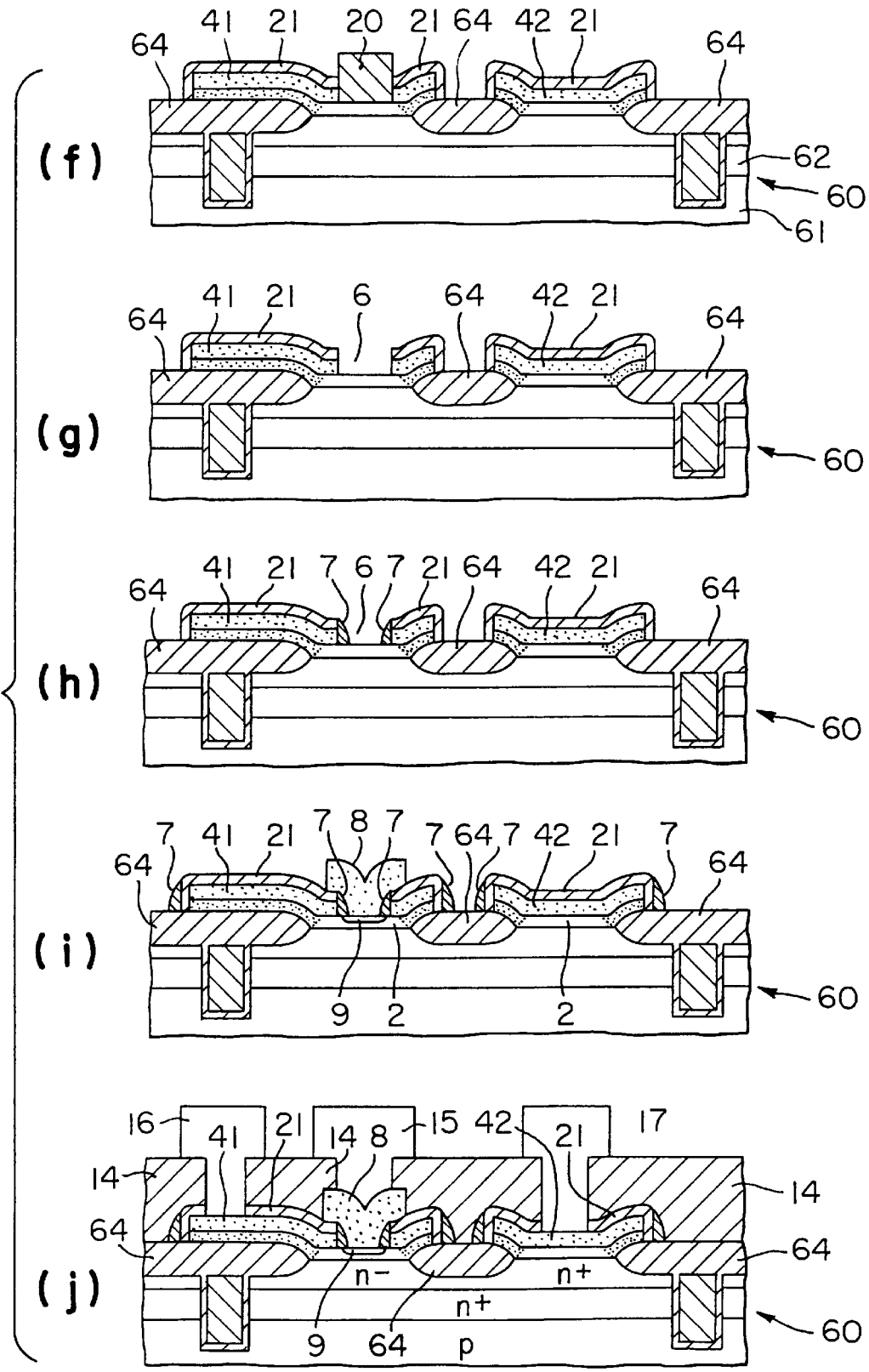
FIGS. 20(a) through (j) are schematic sectional views showing producing steps in the third preferred embodiment of a method for producing a semiconductor device according to the present invention.

Then, after a thick silicon nitride film (Si$_3$N$_4$) (not shown) is deposited on the major surface of the semiconductor substrate 60 by the CVD method, the silicon nitride film is etched by an anisotropic etching, such as the RIE, using a patterned photoresist (not shown) as a mask to form a growth inhibiting film 20 on the element region as shown in FIG. 20(c).

Then, as shown in FIG. 20(d), silicon is caused to selectively grow on the whole major surface of the semiconductor substrate 60 to deposit a thick polycrystalline silicon film 4 on the silicon semiconductor layer 62 formed by the non-selective epitaxial growth, and boron (B) ions are implanted into the polycrystalline silicon film 4.

Then, as shown in FIG. 20(e), the polycrystalline silicon film 4 and the silicon semiconductor layer 2, which has been formed by the non-selective epitaxial growth, are simultaneously patterned to form a base drawing electrode 41 and a collector drawing electrode 42.

Moreover, as shown in FIG. 20(f), the growth inhibiting film 20 is allowed to remain, and an oxide film (SiO$_2$) 21 extending from the side surfaces of the exposed silicon semiconductor layer 62 to the surfaces of the base drawing electrode 41 and the collector drawing electrode 42 is formed by a low temperature oxidation process.

Then, as shown in FIG. 20(g), the growth inhibiting film 20 of a silicon nitride film is removed by the thermal phosphoric acid etchin to form an opening 6 therein for defining an emitter region.

Then, a silicon nitride film (not shown) is deposited on the whole major surface of the semiconductor substrate 1 so as to cover all of the silicon semiconductor layer 62, the opening 6 and the base and collector drawing electrodes 41 and 42. Then, the anisotropic etching, such as the RIE, of the silicon nitride film (not shown) is carried out to form an opening side wall 7 inside of the opening 6 as shown in FIG. 20(h). As shown in FIG. 20h), the opening side wall 7 is formed so as to cover the whole side wall of the opening 6.

A polycrystaline silicon film (not shown) serving as an emitter electrode is deposited, and arsenic ions are implanted into the polycrystalline silicon film. Moreover, the arsenic in the polycrystalline silicon film is caused to diffuse in the epitaxial grown semiconductor layer 2 by heat at a heating step to form an emitter region 9.

Moreover, as shown in FIG. 20(i), the polycrystaline silicon film is patterned by an anisotropic etching, such as the RIE, to form an emitter drawing electrode 8. Then, the interlayer insulator film 14 of SiO$_2$ is patterned by, e.g., the CVD method, to form contact holes (not shown) so as to expose the emitter drawing electrode 8, the base drawing electrode 41 and the collector drawing electrode 42. Finally, as shown in FIG. 20(j), metal electrodes 15, 16 and 17 of aluminum or the like are formed so as to be electrically connected to the drawing electrodes 8, 41 and 42 in the contact holes, respectively. Thus, the production of the bipolar transistor on the semiconductor substrate 1 is completed.

Figure 21:
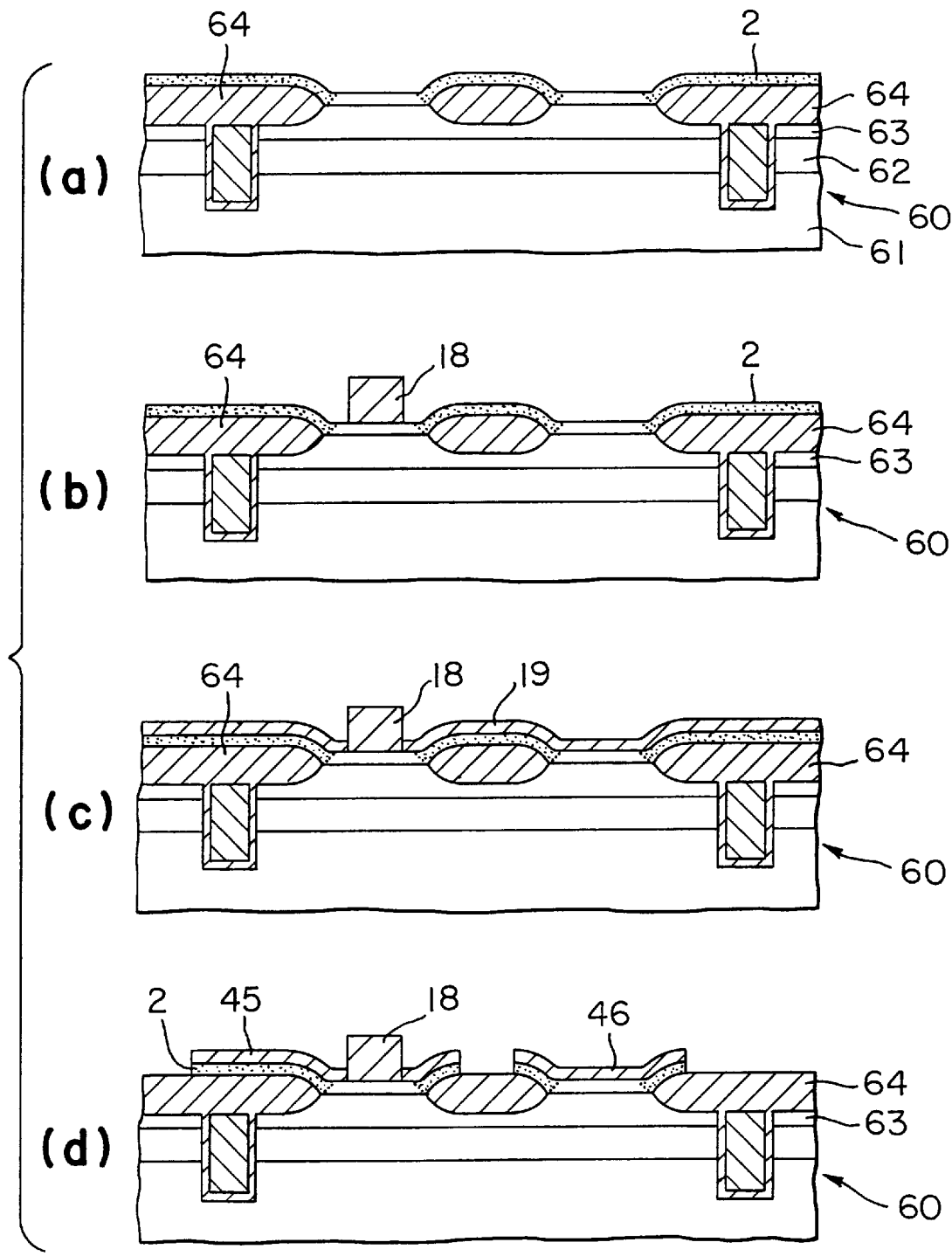
FIGS. 21(a) through 21(h) are schematic sectional views showing producing steps in the fourth preferred embodiment of a method for producing a semiconductor device according to the present invention.
Figure 21:
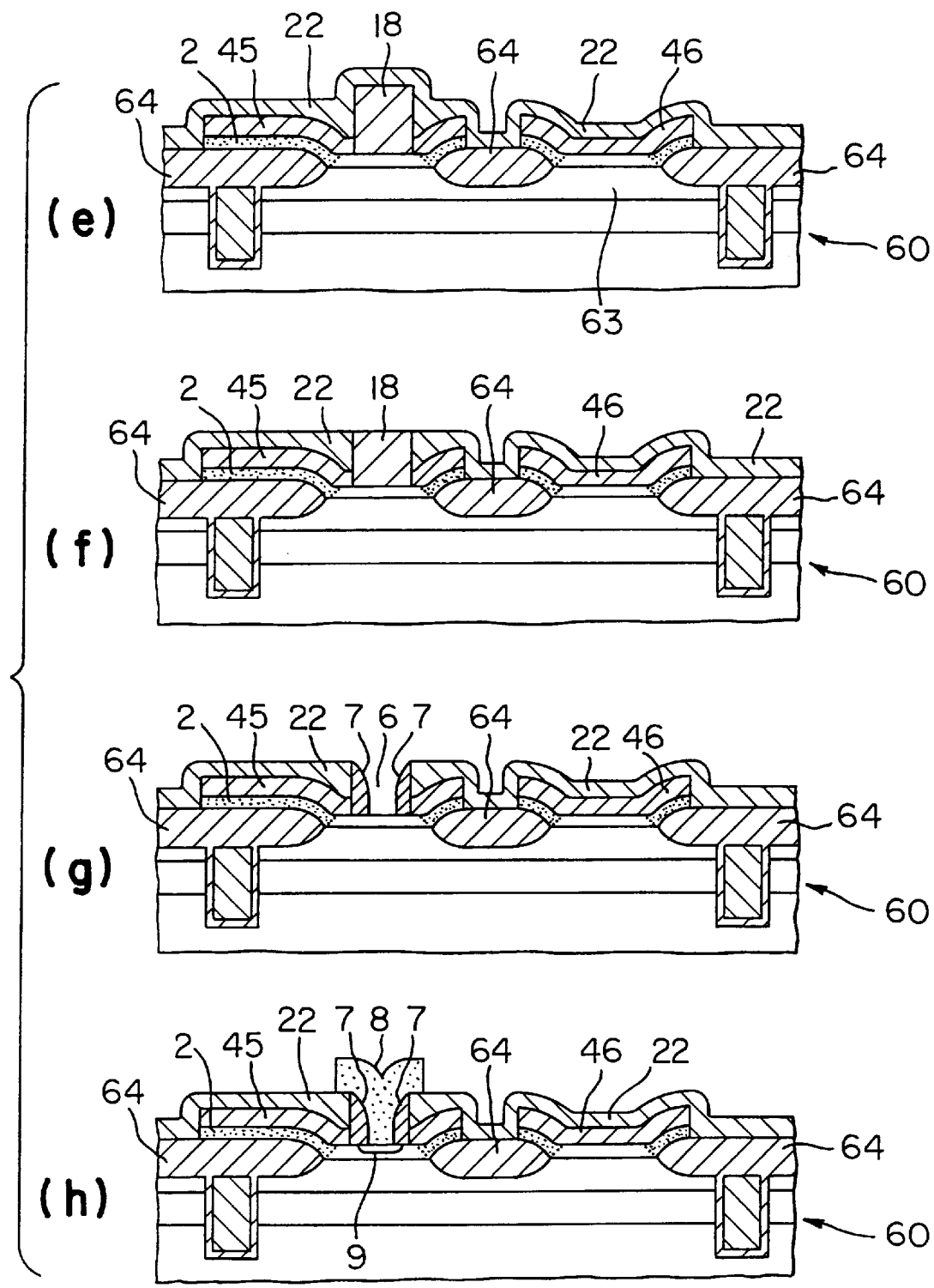
Figure 22:
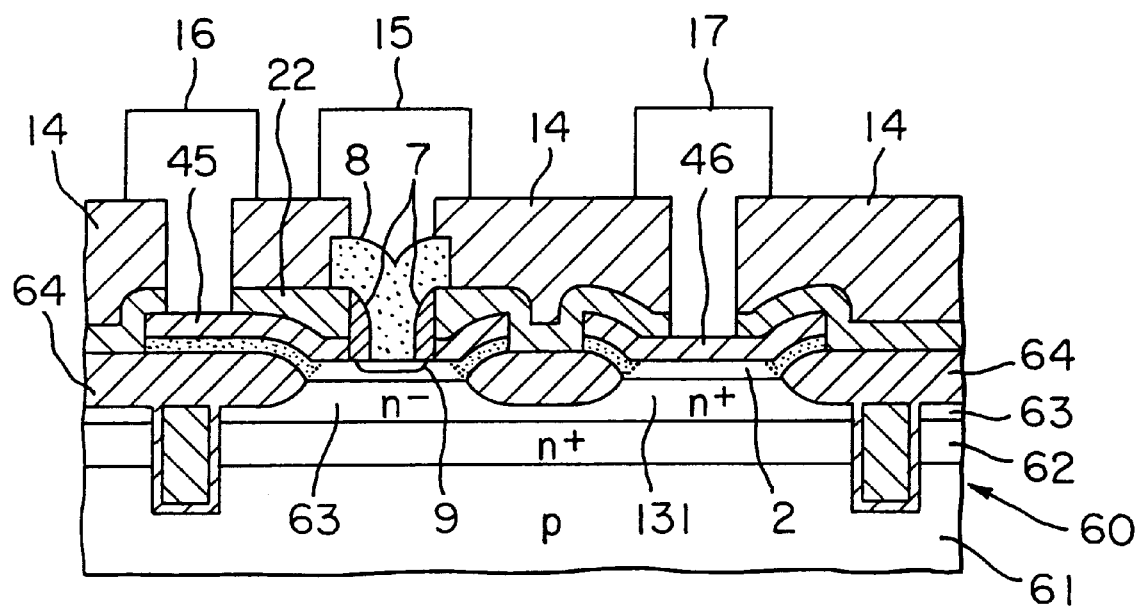
FIG. 22 is a sectional view showing a bipolar transistor as the semiconductor device produced by the fourth embodiment of the method for producing a semiconductor device according to the present invention.

Next, there is described the third embodiment of a method of producing the bipolar transistor by using the LOCOS substrate 60 with reference to FIG. 21 and FIG. 22. The producing method according to the fourth embodiment corresponds to the method according to the second embodiment.

Then, referring to FIGS. 21(a) through 21(h) and FIG. 22, the fourth preferred embodiment of a method for producing a semiconductor device according to the present invention will be described below. FIGS. 21(a) through 21(h) are sectional views showing producing steps in the second preferred embodiment of a method for producing a semiconductor device according to the present invention, and FIG. 22 is a sectional view showing a bipolar transistor as a semiconductor device produced by the second preferred embodiment of a semiconductor device according to the present invention.

In FIG. 21(a), a semiconductor substrate 60 comprises a p-type silicon substrate 61, an n⁺-impurity diffusion region 62 formed by allowing n-type impurity ions to diffuse in the silicon substrate 61 at a high concentration, and an n⁻-epitaxial growth layer 63 allowed to grow on the impurity diffusion region 62. A trench is formed in the major surface of the semiconductor substrate 60 (on the side of the epitaxial growth layer), and an insulating material, such as SiO₂, is filled in the trench to form an element isolating region 64. The surface of an element forming region surrounded by the element isolating region (field oxide film) 64 of the major surface of the semiconductor substrate 1 is exposed. In the epitaxial growth layer 63, a high concentration impurity region 131 serving as a collector region is formed. The second preferred embodiment of a bipolar transistor according to the present invention is formed on the seniconductor substrate 1 thus formed.

First, as shown in FIG. 21(a), a p-type silicon semiconductor layer 60 containing boron (B) is formed on the major surface of the semiconductor substrate 1 (on the surface on which the epitaxial growth layer 63 is formed) by the non-selective epitaial gowth. A p-type mono-crystalline silicon layer containing a p-type mono-crystalline intrinsic base region is formed on the element forming region by the epitaxial growth, and a p-type mono-crystalline silicon layer is formed on a field oxide film of the element isolating region 64.

Then, as shown in FIG. 21(b), a thick silicon oxide film (SiO₂) is deposited on the major surface of the semiconductor substrate 1 by the CVD method, and etched by an anisotropic etching, such as the RIE, using a patterned photoresist (not shown) as a mask to form a growth inhibiting film 18 of a silicon oxide film on the element region.

The selective growth of tungsten or the like on the major surface of the semiconductor substrate 1 is carried out. That is, a tungsten film 19 is deposited on the silicon semiconductor layer 2. As shown in FIG. 21(c), the growth inhibiting film 18 is made of a silicon oxide film, so that the tungsten does not substantially grow on the silicon oxide film.

Then, as shown in FIG. 21(d), the silicon semiconductor layer 2 formed by the non-selective epitaxial growth, together with the tungsten film 19, is patterned to form a base drawing electrode 45 and a collector drawing electrode 46.

Moreover, as shown in FIG. 21(e), a silicon nitride film 22 is deposited on the semiconductor substrate 1 so as to cover the exposed side of the silicon semiconductor layer 2 and the surfaces of the base drawing electrode 45, the collector drawing electrode 46 and the growth inhibiting film 18 while allowing the growth inhibiting film 18 to remain.

Thereafter, as shown in FIG. 21(f), the silicon nitride film 22 on the growth inhibiting film 18 is removed by a polishing method, such as a chemical mechanical polishing method (CMP), to expose the growth inhbiting film 18.

Then, the growth inhibiting film 18 of a silicon nitride film is removed by etching NH₄F to form an opening 6 for defining an emitter region. Thereafter, as sown in FIG. 15, the anisotropic etching, such as the CVD method, of the whole surface of the semiconductor 1 is carried out to form a side wall 7 of an oxide film inside of the opening 6. Thereafter, a polycrystalline silicon film serving as an emitter drawing electrode is deposited, and then, arsenic (As) ions are implanted into the polycrystalline silicon. A heating step is carried out to allow the arsenic in the polycrystalline silicon to diffuse in the silicon semiconductor layer 2 to form an emitter region 9. Moreover, as shown in FIG. 21(h), the polycrystalline silicon film is patterned by the anisotropic etching to form an emitter drawing electrode 8.

Then, an interlayer insulator film 14 of SiO₂ is deposited by, e.g., the CVD method, and the interlayer insulator film 14 is patterned to form contact holes so as to expose the emitter drawing electrode 8, the base drawing electrode 45 and the collector drawing element 46 as shown in FIG. 21(h). Thereafter, similar to the semiconductor device producing method in the first preferred embodiment shown in FIG. 10(a), metal electrodes 15, 16 and 17 are formed of a metal, such as aluminum, so as to be electrically connected to electrodes of contact holes exposing the respective drawing electrodes to complete the production of a bipolar transistor on the semiconductor substrate 60, as shown in FIG. 22.

As described above, since it is not required to use any etching stoppers unlike conventional methods, it is possible to reduce the area of the base region to reduce the base resistance and the base-to-collector junction capacity, so that it is possible to obtain a bipolar transistor which has low power consumption, low noises and a high operation frequency when it is used as an analog element, in comparison with conventional bipolar transistors.

Since the polishing technique (CMP method), which is used in the semiconductor device producing method according to the fourth embodiment, is also a the same as the methods according to the first and second embodiments, the duplicated description is omitted.

As described in the third and fourth embodiments, it is possible to form the bipolar transistor even on the LOCOS substrate 60 such in the third and fourth embodiments, in the same manner of the first and second embodiments.

What is claimed is:

1. A method for producing a semiconductor device, comprising:

allowing epitaxial growth of a semiconductor layer on a major surface of a semiconductor substrate;

forming a growth inhibiting film in a region where an emitter will be formed on said semiconductor layer;

allowing a conductive film to selectively grow on said semiconductor layer on which said growth inhibiting film has been formed wherein growth of said conductive film on and above said region where said emitter will be formed is prevented;

removing said growth inhibiting film to leave an opening exposing a part of said semiconductor layer, wherein said opening is surrounded by said conductive film;

covering an upper surface and a side wall of said conductive film, which is exposed in said region where said emitter will be formed, with an insulator film; and forming an emitter region in a surface region of said semiconductor layer where an emitter will be formed which is surrounded by said conductive film.

2. A method of producing a semiconductor device including a bipolar transistor, said method comprising:

forming an element isolating region in a major surface of a semiconductor substrate to define an element forming region to form a collector region in said element forming region surrounded by said element isolating region;

allowing epitaxial growth of a semiconductor layer on said major surface of said semiconductor substrate to form a base region of said semiconductor layer on said collector region;

forming a growth inhibiting film in a region where an emitter will be formed on said semiconductor layer;

allowing a conductive film to selectively grow on said semiconductor layer on which said growth inhibiting film has been formed, to prevent growth of said conductive film on said region where said emitter will be formed;

removing said growth inhibiting film to leave an opening exposing a part of said semiconductor layer, wherein said opening is surrounded by said conductive film;

covering an upper surface and a side wall of said conductive film, which is exposed in said region where an emitter will be formed, with an insulator film; and forming an emitter region in a surface of said semiconductor layer, in a region where an emitter will be formed, which is surrounded by said conductive film.

3. A method for producing a semiconductor device as set forth in claim 2, wherein said growth inhibiting film is formed of a silicon nitride film or a silicon oxide film.

4. A method for producing a semiconductor device as set forth in claim 2, wherein said semiconductor layer formed on said major surface of said semiconductor substrate has a region of a mono-crystalline semiconductor formed on said element forming region, and a region of a polycrysne semiconductor formed on said element isolating region.

5. A method for producing a semiconductor device as set forth in claim 4, wherein said conductive film has a base electrode, which is electrically connected to said base region via said region of the polycrystalline semiconductor of said semiconductor layer.

6. A method for producing a semiconductor device as set forth in claim 2, wherein said element isolation region is formed of an insulating material buried in a trench formed in said major surface of said semiconductor substrate.

7. A method for producing a semiconductor device as set forth in claim 2, wherein said element isolating region is formed of a LOCOS (LOCalized Oxidation of Silicon) for locally oxidizing silicon on said major surface of said semiconductor substrate.

* * * * *